US012538486B2

US 12,538,486 B2
Jan. 27, 2026

(12) United States Patent
Lee

(10) Patent No.: US 12,538,486 B2
(45) Date of Patent: Jan. 27, 2026

(54) SEMICONDUCTOR MEMORY DEVICE HAVING FIRST NET-SHAPED SOURCE PATTERN, SECOND SOURCE PATTERN AND PAD PATTERN THEREBETWEEN

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1187 days.

(21) Appl. No.: 17/352,003

(22) Filed: Jun. 18, 2021

(65) Prior Publication Data

US 2022/0189977 A1  Jun. 16, 2022

(30) Foreign Application Priority Data

Dec. 10, 2020 (KR) .................. 10-2020-0172452

(51) Int. Cl.
*H10B 41/41* (2023.01)
*G11C 7/18* (2006.01)
(Continued)

(52) U.S. Cl.
CPC .............. *H10B 41/41* (2023.02); *G11C 7/18* (2013.01); *H01L 23/5226* (2013.01);
(Continued)

(58) Field of Classification Search
CPC ........ H10B 41/41; H10B 41/10; H10B 41/27; H10B 43/10; H10B 43/27; H10B 43/40;
(Continued)

(56) References Cited

U.S. PATENT DOCUMENTS 10,580,788 B2   3/2020  Zhu et al.
10,600,763 B1   3/2020  Xiao
(Continued)

FOREIGN PATENT DOCUMENTS

KR   1020190028993 A   3/2019
KR   1020200026336 A   3/2020
KR   1020210023291 A   3/2021

OTHER PUBLICATIONS

J. Hu, et al., "Electrical Properties of Ti/TiN Films Prepared by Chemical Vapor Deposition and Their Applications in Submicron Structures as Contact and Barrier Materials," Thin Solid Films, vols. 308-309, 1997, pp. 589-593, ISSN 0040-6090. (Year: 1997).*
(Continued)

*Primary Examiner* — Davienne N Monbleau
*Assistant Examiner* — John Patrick Cornely
(74) *Attorney, Agent, or Firm* — WILLIAM PARK AND ASSOCIATES LTD.

(57) ABSTRACT

There are provided a semiconductor memory device and a manufacturing method of the same. The semiconductor memory device includes: a peripheral circuit structure with a page buffer group; a net-shaped first source pattern disposed on the peripheral circuit structure, the net-shaped first source pattern with a plurality of openings; a memory cell array disposed on the net-shaped first source pattern; a second source pattern disposed between the net-shaped first source pattern and the memory cell array; and a cell-array-side pad pattern, disposed between the net-shaped first source pattern and the second source pattern, extending toward the net-shaped first source pattern from the second source pattern, the cell-array-side pad pattern being bonded directly to the net-shaped first source pattern.

11 Claims, 27 Drawing Sheets

(51) Int. Cl.
*H01L 23/522* (2006.01)
*H01L 23/528* (2006.01)
*H10B 41/10* (2023.01)
*H10B 41/27* (2023.01)
*H10B 43/10* (2023.01)
*H10B 43/27* (2023.01)
*H10B 43/40* (2023.01)

(52) U.S. Cl.
CPC ......... *H01L 23/5283* (2013.01); *H10B 41/10* (2023.02); *H10B 41/27* (2023.02); *H10B 43/10* (2023.02); *H10B 43/27* (2023.02); *H10B 43/40* (2023.02)

(58) Field of Classification Search
CPC ........ H10B 41/20; H10B 41/30; H10B 41/40; H10B 41/50; H10B 43/20; H10B 43/50; H10B 43/30; H10B 43/35; G11C 7/18; H01L 23/5226; H01L 23/5283; H01L 21/76898; H01L 24/05; H01L 25/0657
See application file for complete search history.

(56) References Cited

U.S. PATENT DOCUMENTS

| | | | |
|---|---|---|---|
| 2019/0081065 A1* | 3/2019 | Lee | H10B 43/30 |
| 2019/0326315 A1* | 10/2019 | Lee | H01L 29/42344 |
| 2020/0091164 A1 | 3/2020 | Liu | |
| 2021/0265271 A1* | 8/2021 | Chung | H01L 25/18 |
| 2021/0351196 A1* | 11/2021 | Cheng | H10B 43/40 |
| 2022/0157841 A1* | 5/2022 | Tsutsumi | G11C 7/18 |

OTHER PUBLICATIONS

"Silicon Resistivity Ranges," Silicon Resistivity | UniversityWafer, Inc., www.universitywafer.com/silicon-resistivity.html, accessed Apr. 7, 2025. (Year: 2025).*

* cited by examiner

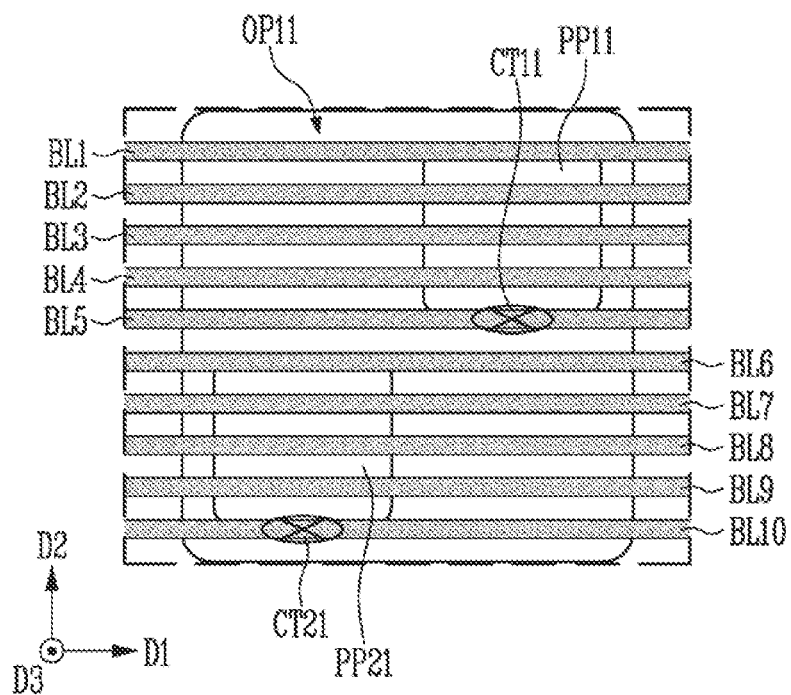

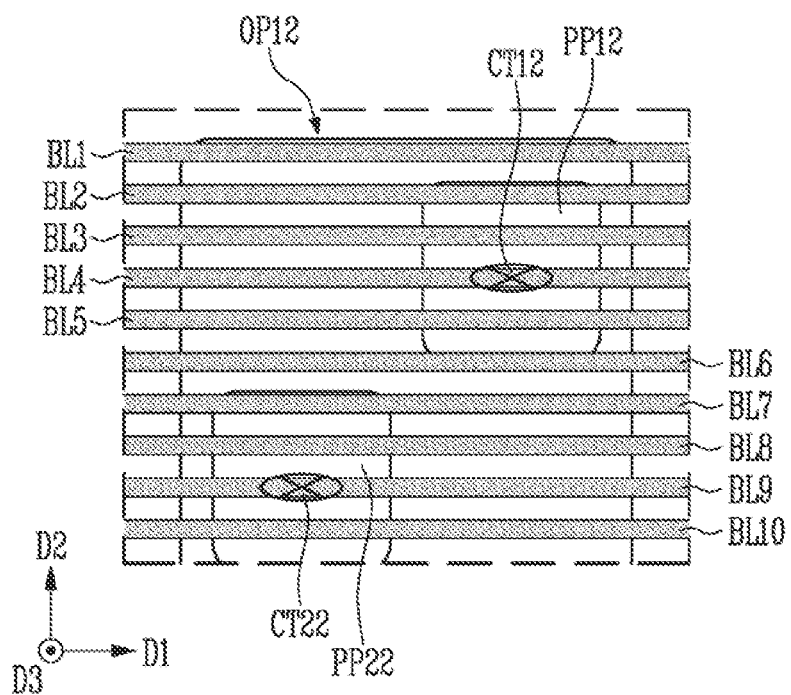

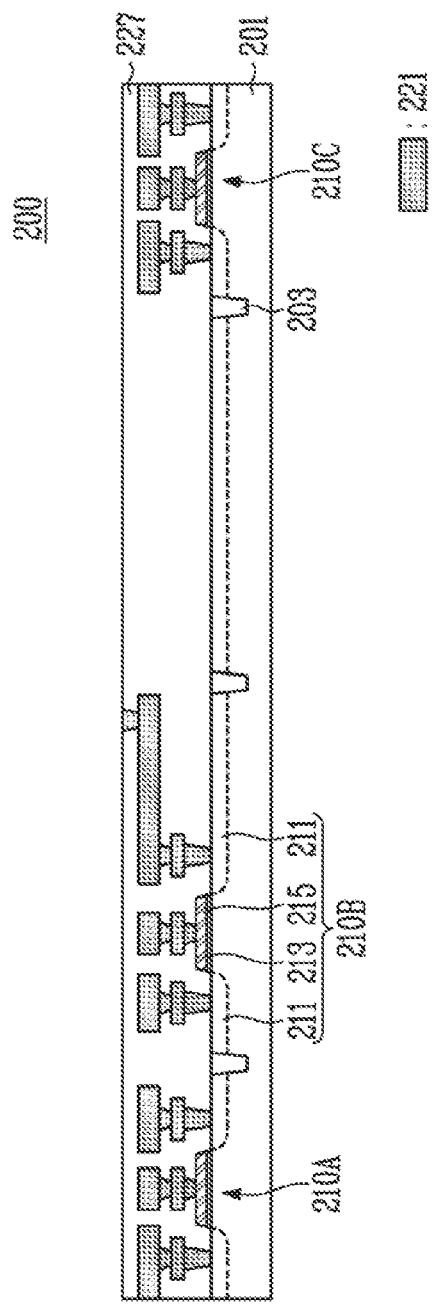

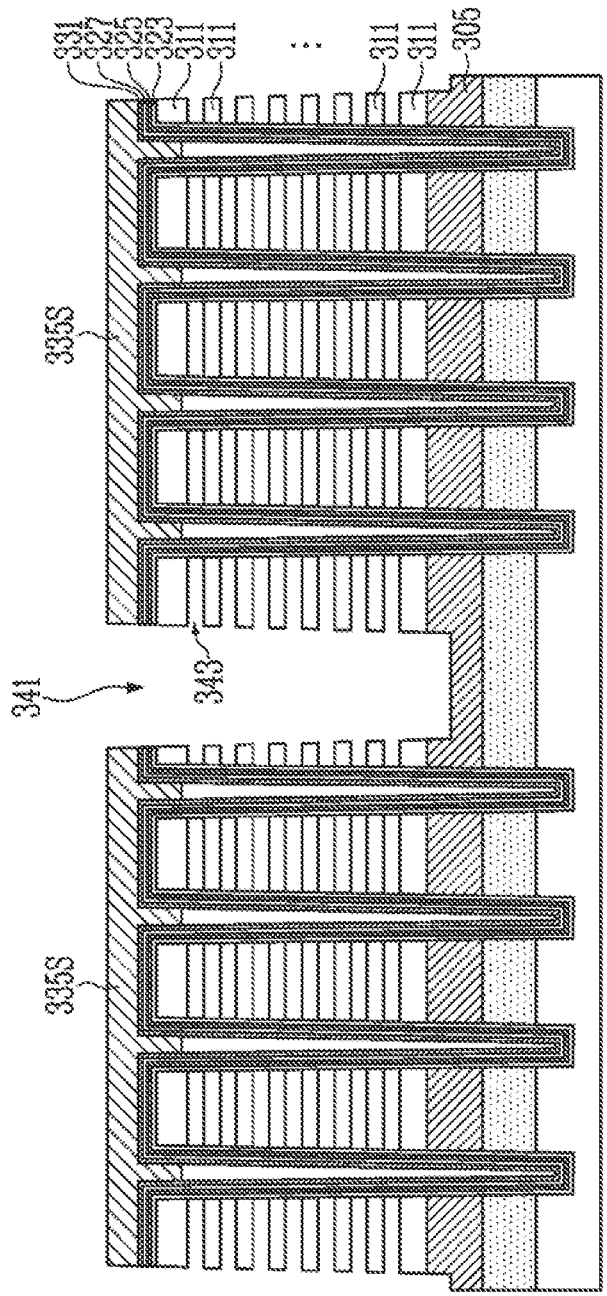

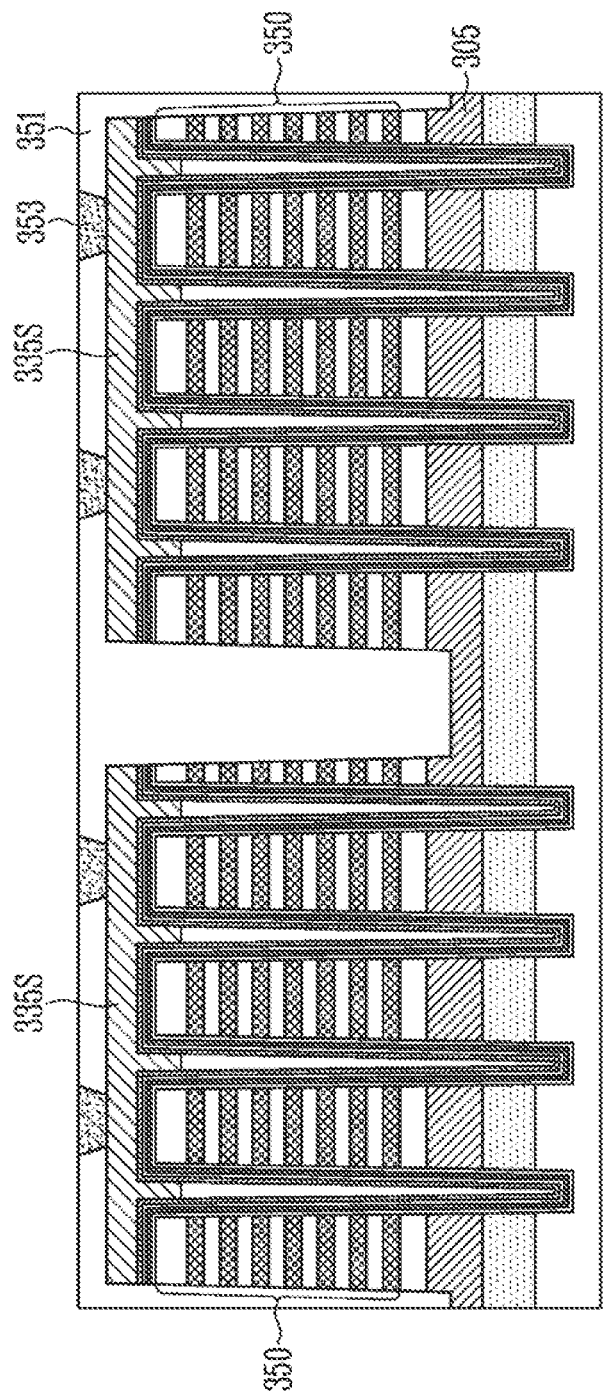

SEMICONDUCTOR MEMORY DEVICE HAVING FIRST NET-SHAPED SOURCE PATTERN, SECOND SOURCE PATTERN AND PAD PATTERN THEREBETWEEN

CROSS-REFERENCE TO RELATED APPLICATION

The present application claims priority under 35 U.S.C. § 119(a) to Korean patent application number 10-2020-0172452 filed on Dec. 10, 2020, in the Korean Intellectual Property Office, the entire disclosure of which is incorporated by reference herein.

BACKGROUND

1. Technical Field

The present disclosure may generally relate to a semiconductor memory device and a manufacturing method of the semiconductor memory device, and more particularly, to a semiconductor memory device including a memory cell array disposed on a peripheral circuit and a manufacturing method of the semiconductor memory device.

2. Related Art

A semiconductor memory device may include a memory cell array including a plurality of memory cells and a peripheral circuit for controlling an operation of the memory cell array. The memory cell array is disposed on the peripheral circuit so that the degree of integration of the semiconductor memory device can be improved.

SUMMARY

In accordance with an embodiment of the present disclosure, a semiconductor memory device includes: a peripheral circuit structure with a page buffer group; a net-shaped first source pattern disposed over the peripheral circuit structure, the net-shaped first source pattern with a plurality of openings; a memory cell array disposed over the net-shaped first source pattern; a second source pattern disposed between the net-shaped first source pattern and the memory cell array; and a cell-array-side pad pattern, disposed between the net-shaped first source pattern and the second source pattern, extending toward the net-shaped first source pattern from the second source pattern, the cell-array-side pad pattern being bonded directly to the net-shaped first source pattern.

In accordance with an embodiment of the present disclosure, a semiconductor memory device includes: a peripheral circuit structure with a page buffer group; a first source pattern disposed over the peripheral circuit structure, the first source pattern with a source contact region and a page buffer connection region; a first opening penetrating the first source pattern in the page buffer connection region; a peripheral-circuit-side first pad pattern disposed in the first opening, the peripheral-circuit-side first pad pattern being connected to the page buffer group; a second source pattern overlapping with the first source pattern in the source contact region; a memory cell array disposed over the second source pattern; a first bit line disposed over the memory cell array, the first bit line extending to overlap with the peripheral-circuit-side first pad pattern; and a first contact structure extending toward the first bit line from the peripheral-circuit-side first pad pattern.

In accordance with an embodiment of the present disclosure, a method of manufacturing a semiconductor memory device, the method includes: forming a peripheral circuit structure with a page buffer group and an interconnection that is connected to the page buffer group; forming a metal pattern group on the peripheral circuit structure, the metal pattern group with a first source pattern and a peripheral-circuit-side pad pattern; forming, over a substrate, a preliminary memory structure, a second source pattern that is connected to the preliminary memory structure, and a cell-array-side pad pattern connected to the second source pattern; bonding the cell-array-side pad pattern to the first source pattern; removing the substrate; forming a contact structure that is connected to the peripheral-circuit-side pad pattern; and forming a bit line that overlaps with the peripheral circuit structure with the second source pattern interposed between the bit line and the peripheral circuit structure, the bit line being connected to the contact structure.

BRIEF DESCRIPTION OF THE DRAWINGS

Illustrative embodiments will now be described more fully hereinafter with reference to the accompanying drawings; however, other embodiments may take on different forms. Therefore, possible embodiments of the present teachings should not be construed as being limited to the specific embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A to 5E are plan views illustrating peripheral-circuit-side pad patterns shown in FIG. 4 and bit lines and contact structures, which are connected to the peripheral-circuit-side pad patterns.

FIG. 8 is a sectional view illustrating a process of forming a peripheral circuit structure in accordance with an embodiment of the present disclosure.

FIGS. 10A to 10D are process sectional views illustrating a process of forming a preliminary memory structure in accordance with an embodiment of the present disclosure.

FIG. 11 is a sectional view illustrating a method of forming cell-array-side pad patterns in accordance with an embodiment of the present disclosure.

DETAILED DESCRIPTION

Specific structural or functional descriptions disclosed herein are merely illustrative for the purpose of describing embodiments according to the concept of the present disclosure. Embodiments can be implemented in various forms, and thus, possible embodiments should not be construed as being limited to the embodiments set forth herein.

Hereinafter, the terms 'first' and 'second' are used to distinguish one component from another component and not to indicate a number or order of components. As such, the components should not be limited by these terms.

Embodiments are directed to a semiconductor memory device in which a peripheral circuit and a memory cell array can be electrically connected to each other, and a manufacturing method of the semiconductor memory device.

Figure 1:
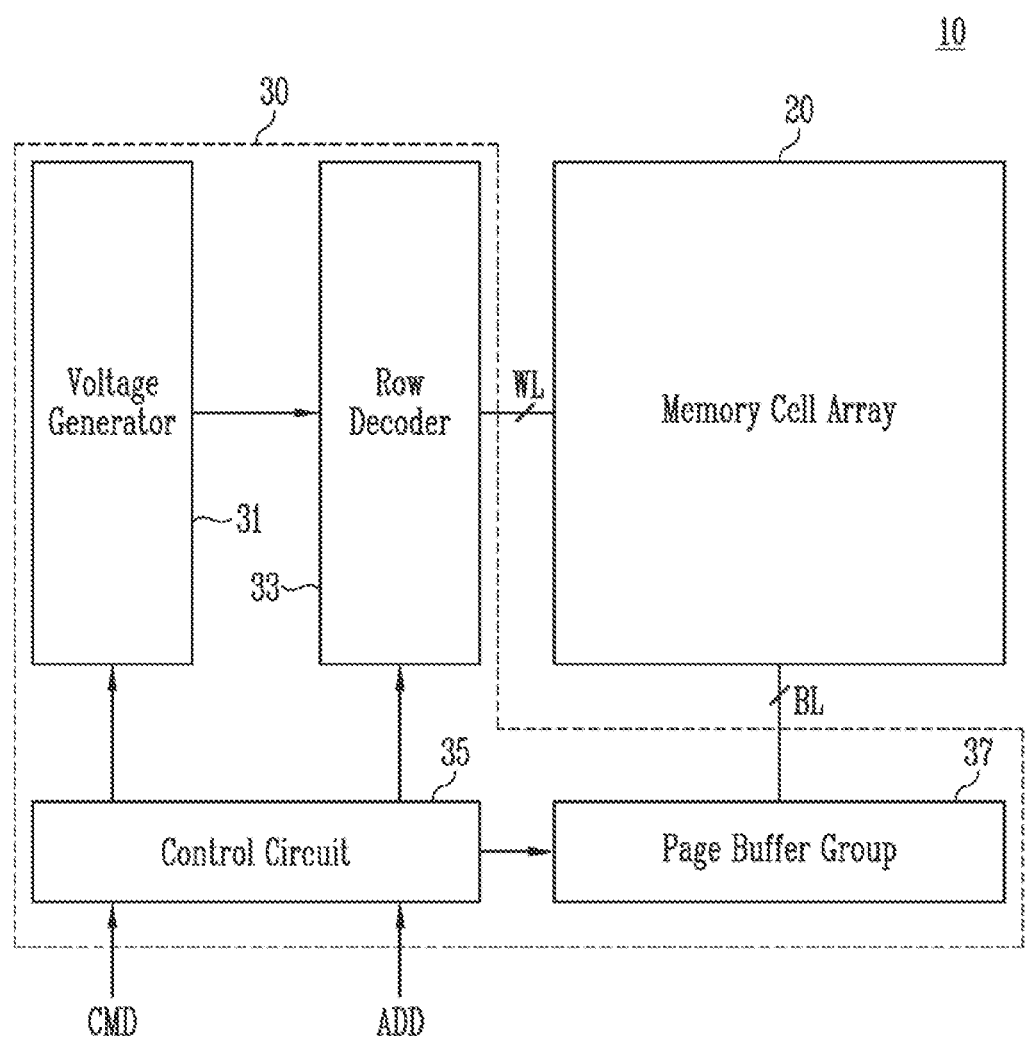
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 10 may include a peripheral circuit 30 and a memory cell array 20.

The peripheral circuit 30 may be configured to control a program operation for storing data in the memory cell array 20, a read operation for outputting data that is stored in the memory cell array 20, and an erase operation for erasing data that is stored in the memory cell array 20.

In an embodiment, the peripheral circuit 30 may include a voltage generator 31, a row decoder 33, a control circuit 35, and a page buffer group 37.

The memory cell array 20 may include a plurality of memory blocks. The memory cell array 20 may be connected to the row decoder 33 through word lines WL and may be connected to the page buffer group 37 through bit lines BL.

The control circuit 35 may control the peripheral circuit 30 in response to a command CMD and an address ADD.

The voltage generator 31 may generate various operating voltages based on the control of the control circuit 35. The operating voltages may include a pre-erase voltage, an erase voltage, a ground voltage, a program voltage, a verify voltage, a pass voltage, a read voltage, and the like, which are used for a program operation, a read operation, and an erase operation.

The row decoder 33 may select a memory block based on the control of the control circuit 35. The row decoder 33 may apply operating voltages to word lines WL that are connected to the selected memory block.

The page buffer group 37 may be connected to the memory cell array 20 through the bit lines BL. The page buffer group 37 may temporarily store data that is received from an input/output circuit (not shown) in a program operation based on the control of the control circuit 35. The page buffer group 37 may sense a voltage or current of the bit lines BL in a read operation or a verify operation based on the control of the control circuit 35. The page buffer group 37 may select the bit lines BL based on the control of the control circuit 35.

Structurally, the memory cell array 20 may overlap with a portion of a peripheral circuit structure, constituting the peripheral circuit 30. Accordingly, a two-dimensional area occupied by the semiconductor memory device may be reduced.

Figure 2:
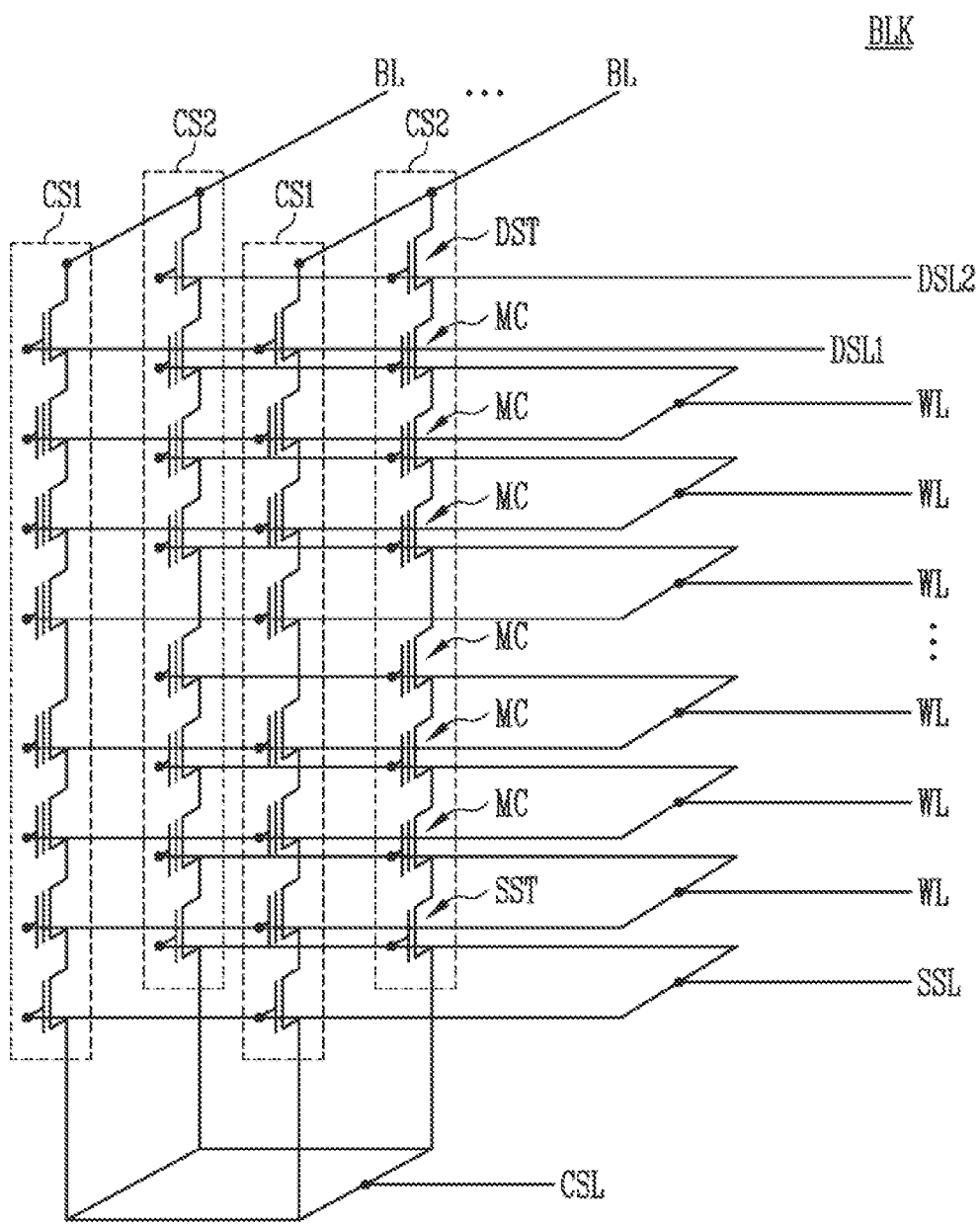
FIG. 2 is a circuit diagram illustrating a memory block in accordance with an embodiment of the present disclosure.

FIG. 2 is a circuit diagram illustrating a memory block in accordance with an embodiment of the present disclosure.

Referring to FIG. 2, the memory block BLK may include a plurality of cell strings CS1 and CS2. The plurality of cell strings CS1 and CS2 may be divided into string groups. The string groups may be respectively controlled by two or more drain select lines DSL1 and DSL2 that are separated from each other at the same level. In an embodiment, the two or more drain select lines DSL1 and DSL2 may include a first drain select line DSL1 and a second drain select line DSL2 that are separated from each other at the same level. The plurality of cell strings CS1 and CS2 may include a first cell string CS1 that is connected to the first drain select line DSL1 and a second cell string CS2 that is connected to the second drain select line DSL2.

The first cell string CS1 and the second cell string CS2 may be connected to word lines WL, a source select line SSL, a bit line BL, and a common source pattern CSL.

Each of the first cell string CS1 and the second cell string CS2 may include a plurality of memory cells MC that are connected in series, at least one source select transistor SST that is connected to the plurality of memory cells MC, and at least one drain select transistor DST that is connected to the plurality of memory cells MC. The common source pattern CSL may be connected to the plurality of memory cells MC via the source select transistor SST. The bit line BL may be connected to the plurality of memory cells MC via the drain select transistor DST.

The first drain select line DSL1 may be connected to a gate of a drain select transistor DST of the first cell string CS1, and the second drain select line DSL2 may be connected to a gate of a drain select transistor DST of the second cell string CS2. The word lines WL may be respectively connected to gates of the memory cells MC. The source select line SSL may be connected to a gate of the source select transistor SST.

According to the above-described structure, the first cell string CS1 and the second cell string CS2, which are commonly connected to one word line and one bit line, may be independently controlled by the first drain select line DSL1 and the second drain select line DSL2.

Figure 3:
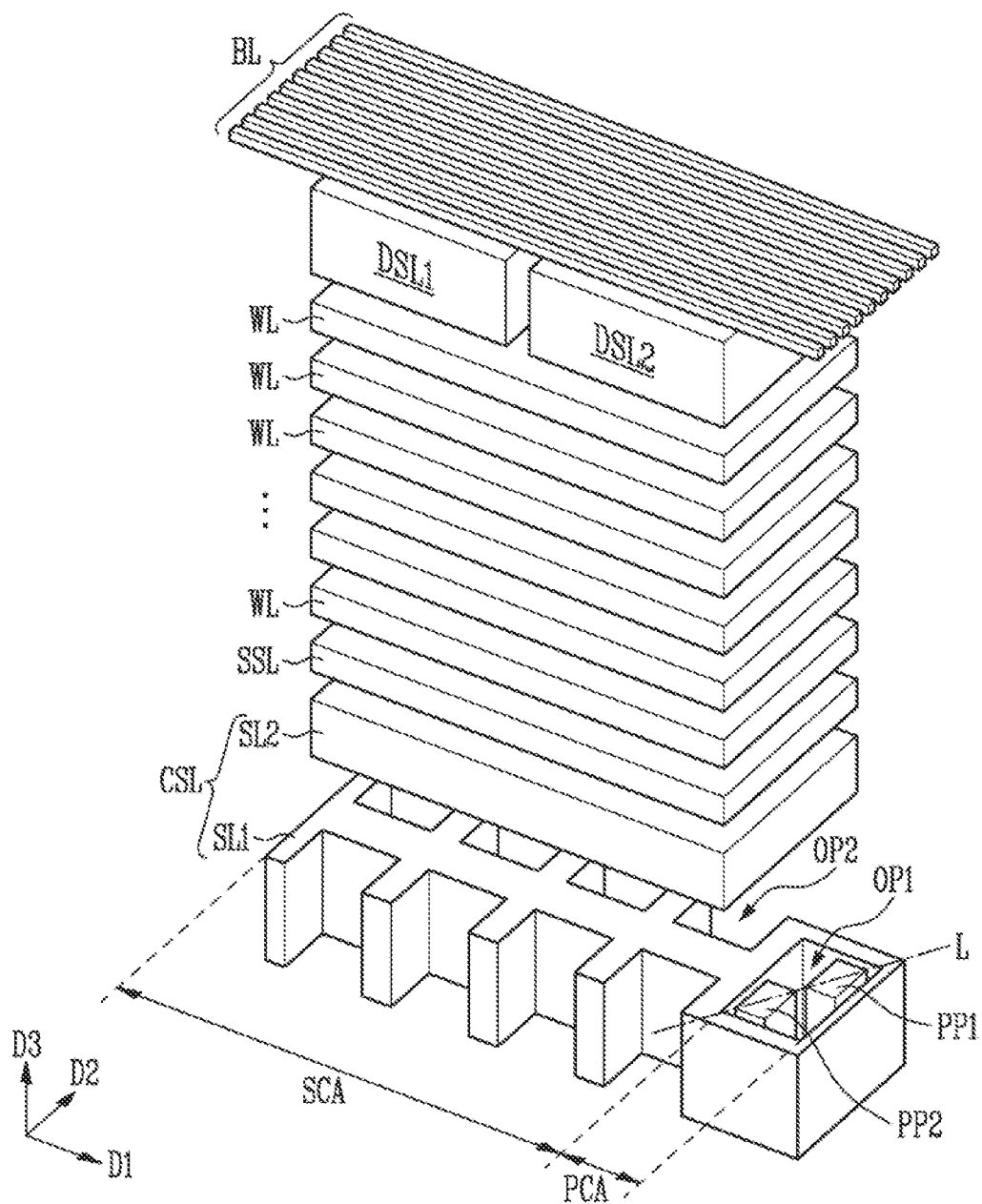
FIG. 3 is a perspective view schematically illustrating a semiconductor memory device in accordance with an embodiment of the present disclosure.

FIG. 3 is a perspective view schematically illustrating a semiconductor memory device in accordance with an embodiment of the present disclosure.

Referring to FIG. 3, the semiconductor memory device may include a common source pattern CSL, a source select line SSL, word lines WL, a first drain select line DSL1, a second drain select line DSL2, bit lines BL, and peripheral-circuit-side pad patterns PP1 and PP2.

The common source pattern CSL may include a first source pattern SL1 and a second source pattern SL2.

The first source pattern SL1 may extend in a first direction D1 and a second direction D2. The first source pattern SL1 may include a source contact region SCA and a page buffer connection region PCA. The first source pattern SL1 may be net-shaped with a first opening OP1 and a second opening OP2. The first opening OP1 may penetrate the first source pattern SL1 in the page buffer connection region PCA. The second opening OP2 may penetrate the first source pattern SL1 in the source contact region SCA.

The second source pattern SL2 may be spaced apart from the first source pattern SL1 in a third direction D3. The third direction D3 may be defined as a direction that is orthogonal to the first direction D1 and second direction D2. The second source pattern SL2 may overlap with the first source pattern SL1 in the source contact region SCA. The first source pattern SL1 may protrude farther in the first direction D1 than the second source pattern SL2, protruding into the page buffer connection region PCA from the source contact region SCA. Accordingly, in the page buffer connection region PCA, the first source pattern SL1 might not overlap with the second source pattern SL2 but may be exposed by the absence of the second source pattern SL2.

The source select line SSL may be disposed on the second source pattern SL2. The source select line SSL may be spaced apart from the second source pattern SL2 in the third direction D3.

The word lines WL may be disposed on the source select line SSL. The word lines WL may be spaced apart from the source select line SSL in the third direction D3. The word lines WL may be arranged to be spaced apart from each other in the third direction D3.

One source select line SSL may be disposed between the second source pattern SL2 and the lowermost word line WL among the word lines WL. However, the embodiment of the present disclosure is not limited thereto. In an embodiment, two or more source select lines spaced apart from each other in the third direction D3 may be disposed between the second source pattern SL2 and the lowermost word line WL.

The first drain select line DSL1 and the second drain select line DSL2 may be disposed at the same level on the word lines WL. The first drain select line DSL1 and the second drain select line DSL2 may be spaced apart from the word lines WL in the third direction D3. The first drain select line DSL1 and the second drain select line DSL2 may be arranged to be spaced apart from each other in the first direction D1.

The bit lines BL may be disposed on the first drain select line DSL1 and the second drain select line DSL2. The bit lines BL may be spaced apart from the first drain select line DSL1 and the second drain select line DSL2 in the third direction D3. The bit lines BL may extend in a direction that intersects with the first drain select line DSL1 and the second drain select line DSL2. In an embodiment, the bit lines BL may extend in the first direction D1.

One first drain select line DSL1 and one second drain select line DSL2 may be disposed between the bit line BL and the uppermost word line WL among the word lines WL. However, the embodiment of the present disclosure is not limited thereto. In an embodiment, two or more first drain select lines that are spaced apart from each other in the third direction D3 and two or more second drain select lines that are spaced apart from each other in the third direction D3 may be disposed between the bit line BL and the uppermost word line WL.

The peripheral-circuit-side pad patterns PP1 and PP2 may be made of the same conductive material as the first source pattern SL1. In an embodiment, the peripheral-circuit-side pad patterns PP1 and PP2 and the first source pattern SL1 may include aluminum.

The peripheral-circuit-side pad patterns PP1 and PP2 may be disposed at a level that is substantially equal to that of the first source pattern SL1. The peripheral-circuit-side pad patterns PP1 and PP2 may be disposed in the first opening OP1 to be spaced apart from the first source pattern SL1. In an embodiment, the peripheral-circuit-side pad patterns PP1 and PP2 may include a peripheral-circuit-side first pad pattern PP1 and a peripheral-circuit-side second pad pattern PP2, which are spaced apart from each other in the first opening OP1. In the plane view, the peripheral-circuit-side first pad pattern PP1 and the peripheral-circuit-side second pad pattern PP2 may be disposed on a diagonal line L to be offset. The diagonal line L might not be parallel to the bit lines BL and might not be orthogonal to the bit lines BL. In an embodiment, the diagonal line L may be disposed between an axis that faces the first direction D1 and an axis that faces the second direction D2. The direction in which the diagonal line L faces may be defined as a diagonal direction.

Hereinafter, the term "metal pattern group" is defined as a term including the first source pattern SL1, the peripheral-circuit-side first pad pattern PP1, and the peripheral-circuit-side second pad pattern PP2.

Figure 4:
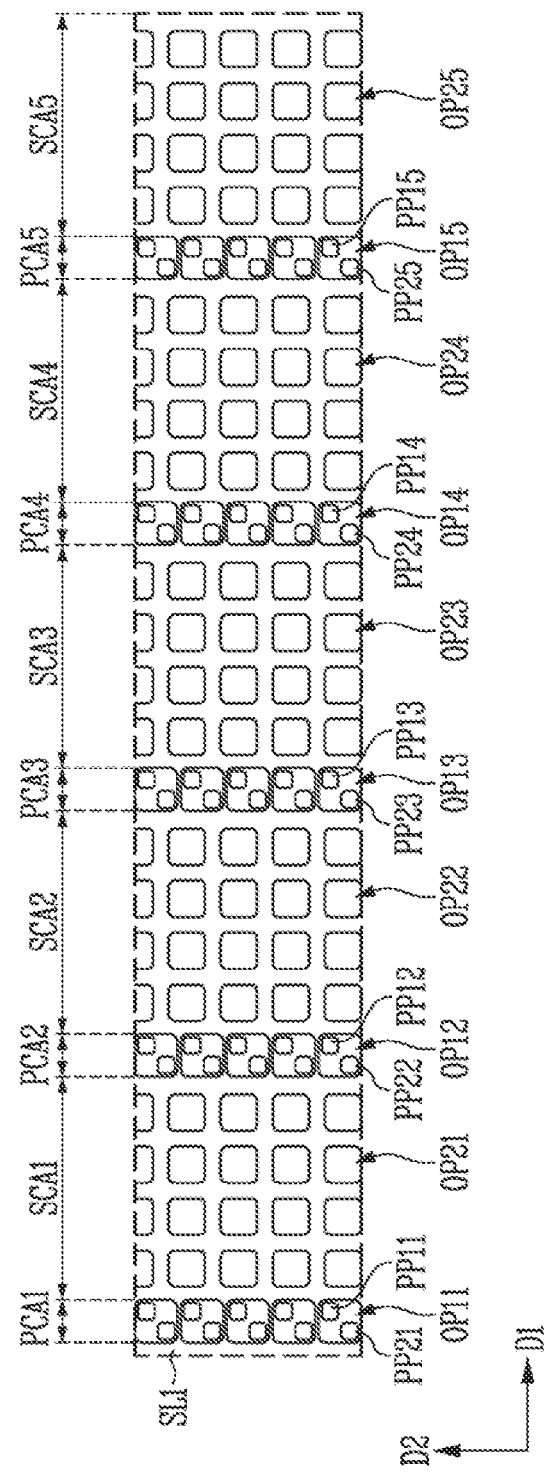
FIG. 4 is a plan view illustrating a metal pattern group in accordance with an embodiment of the present disclosure.

FIG. 4 is a plan view illustrating a metal pattern group in accordance with an embodiment of the present disclosure. For a more detailed description of a layout of the metal pattern group shown in FIG. 3, a metal pattern group in a range wider than that shown in FIG. 3 is illustrated in FIG. 4.

Referring to FIG. 4, the metal pattern group may include a first source pattern SL1, peripheral-circuit-side first pad patterns PP11, PP12, PP13, PP14, and PP15, and peripheral-circuit-side second pad patterns PP21, PP22, PP23, PP24, and PP25 as described with reference to FIG. 3.

The first source pattern SL1 may extend on a plane that is created by the first direction D1 and the second direction D2. The first source pattern SL1 may be net-shaped with a plurality of first openings OP11, OP12, OP13, OP14, and OP15 and a plurality of second openings OP21, OP22, OP23, OP24, and OP25. The first source pattern SL1 may include page buffer connection regions PCA1, PCA2, PCA3, PCA4, and PCA5 and source contact regions SCA1, SCA2, SCA3, SCA4, and SCA5, which are alternately disposed in the first direction D1.

In an embodiment, the page buffer connection regions may include a first page buffer connection region PCA1, a second page buffer connection region PCA2, a third page buffer connection region PCA3, a fourth page buffer connection region PCA4, and a fifth page buffer connection region PCA5, which are arranged to be spaced apart from each other in the first direction D1. In an embodiment, the source contact regions may include a first source contact region SCA1, a second source contact region SCA2, a third source contact region SCA3, a fourth source contact region SCA4, and a fifth source contact region SCA5, which are arranged to be spaced apart from each other in the first direction D1. The first source pattern SL1 may extend from the first page buffer connection region PCA1 to the first source contact region SCA1 and may extend from the first source contact region SCA1 to the second page buffer connection region PCA2. The first source pattern SL1 may extend from the second page buffer connection region PCA2 to the second source contact region SCA2 and may extend from the second source contact region SCA2 to the third page buffer connection region PCA3. The first source pattern SL1 may extend from the third page buffer connection region PCA3 to the third source contact region SCA3 and may extend from the third source contact region SCA3 to the fourth page buffer connection region PCA4. The first source pattern SL1 may extend from the fourth page buffer connection region PCA4 to the fourth source contact region SCA4 and may extend from the fourth source contact region SCA4 to the fifth page buffer connection region PCA5. The first source pattern SL1 may extend from the fifth page buffer connection region PCA5 to the fifth source contact region SCA5.

An arrangement of the first openings OP11, OP12, OP13, OP14, and OP15 may be designed in various ways based on the arrangement of the peripheral-circuit-side first pad patterns PP11, PP12, PP13, PP14, and PP15 and the peripheral-circuit-side second pad patterns PP21, PP22, PP23, PP24, and PP25.

The first openings OP11, OP12, OP13, OP14, and OP15 may include a first opening OP11 of a first group that penetrates the first page buffer connection region PCA1, a first opening OP12 of a second group that penetrates the second page buffer connection region PCA2, a first opening OP13 of a third group that penetrates the third page buffer connection region PCA3, a first opening OP14 of a fourth group that penetrates the fourth page buffer connection region PCA4, and a first opening OP15 of a fifth group that penetrates the fifth page buffer connection region PCA5.

The peripheral-circuit-side first pad patterns may include a peripheral-circuit-side first pad pattern PP11 of a first group, a peripheral-circuit-side first pad pattern PP12 of a second group, a peripheral-circuit-side first pad pattern PP13 of a third group, a peripheral-circuit-side first pad pattern PP14 of a fourth group, and a peripheral-circuit-side first pad pattern PP15 of a fifth group. The peripheral-circuit-side second pad patterns may include a peripheral-circuit-side second pad pattern PP21 of a first group, a peripheral-circuit-side second pad pattern PP22 of a second group, a peripheral-circuit-side second pad pattern PP23 of a third group, a peripheral-circuit-side second pad pattern PP24 of a fourth group, and a peripheral-circuit-side second pad pattern PP25 of a fifth group.

Like the peripheral-circuit-side first and second pad patterns PP1 and PP2 that are described with reference to FIG. 3, the peripheral-circuit-side first and second pad patterns PP11 and PP21 of the first group may be arranged in a diagonal direction in the first opening OP11 of the first group in the plan view. The peripheral-circuit-side first and second pad patterns PP12 and PP22 of the second group may be arranged in a diagonal direction in the first opening OP12 of the second group, the peripheral-circuit-side first and second pad patterns PP13 and PP23 of the third group may be arranged in a diagonal direction in the first opening OP13 of the third group, the peripheral-circuit-side first and second pad patterns PP14 and PP24 of the fourth group may be arranged in a diagonal direction in the first opening OP14 of the fourth group, and the peripheral-circuit-side first and second pad patterns PP15 and PP25 of the fifth group may be arranged in a diagonal direction in the first opening OP15 of the fifth group. From the two-dimensional viewpoint, the diagonal direction may be a direction different from the first direction D1 and the second direction D2.

The second openings OP21, OP22, OP23, OP24, and OP25 may include a second opening OP21 of a first group that penetrates the first source contact region SCA1, a second opening OP22 of a second group that penetrates the second source contact region SCA2, a second opening OP23 of a third group that penetrates the third source contact region SCA3, a second opening OP24 of a fourth group that penetrates the fourth source contact region SCA4, and a second opening OP25 of a fifth group that penetrates the fifth source contact region SCA5.

FIGS. 5A to 5E are plan views illustrating the peripheral-circuit-side pad patterns shown in FIG. 4 and bit lines and contact structures, which are connected to the peripheral-circuit-side pad patterns. The peripheral-circuit-side first and second pad patterns PP11 and PP21 of the first group, which are shown in FIG. 4, are enlarged and illustrated in FIG. 5A, the peripheral-circuit-side first and second pad patterns PP12 and PP22 of the second group, which are shown in FIG. 4, are enlarged and illustrated in FIG. 5B, the peripheral-circuit-side first and second pad patterns PP13 and PP23 of the third group, which are shown in FIG. 4, are enlarged and illustrated in FIG. 5C, the peripheral-circuit-side first and second pad patterns PP14 and PP24 of the fourth group, which are shown in FIG. 4, are enlarged and illustrated in FIG. 5D, and the peripheral-circuit-side first and second pad patterns PP15 and PP25 of the fifth group, which are shown in FIG. 4, are enlarged and illustrated in FIG. 5E.

Referring to FIGS. 5A to 5E, the semiconductor memory device may include bit lines BL1 to BL10 that overlap with each of the first opening OP11 of the first group, the first opening OP12 of the second group, the first opening OP13 of the third group, the first opening OP14 of the fourth group, and the first opening OP15 of the fifth group. Two or more bit lines may overlap with each of the peripheral-circuit-side first and second pad patterns PP11 and PP21 of the first group, the peripheral-circuit-side first and second pad patterns PP12 and PP22 of the second group, the peripheral-circuit-side first and second pad patterns PP13 and PP23 of the third group, the peripheral-circuit-side first and second pad patterns PP14 and PP24 of the fourth group, and the peripheral-circuit-side first and second pad patterns PP15 and PP25 of the fifth group.

The bit lines BL1 to BL10 may be respectively connected to the peripheral-circuit-side first and second pad patterns PP11 and PP21 of the first group, the peripheral-circuit-side first and second pad patterns PP12 and PP22 of the second group, the peripheral-circuit-side first and second pad patterns PP13 and PP23 of the third group, the peripheral-circuit-side first and second pad patterns PP14 and PP24 of the fourth group, and the peripheral-circuit-side first and second pad patterns PP15 and PP25 of the fifth group by contact structures CT11, CT21, CT12, CT22, CT13, CT23, CT14, CT24, CT15, and CT25.

The contact structures CT11, CT21, CT12, CT22, CT13, CT23, CT14, CT24, CT15, and CT25 may be connected to the peripheral-circuit-side first and second pad patterns PP11 and PP21 of the first group, the peripheral-circuit-side first and second pad patterns PP12 and PP22 of the second group, the peripheral-circuit-side first and second pad patterns PP13 and PP23 of the third group, the peripheral-circuit-side first and second pad patterns PP14 and PP24 of the fourth group, and the peripheral-circuit-side first and second pad patterns PP15 and PP25 of the fifth group, and may extend in the third direction D3. The contact structures CT11, CT21, CT12, CT22, CT13, CT23, CT14, CT24, CT15, and CT25 may include first and second contact structures CT11 and CT21 of a first group, first and second contact structures CT12 and CT22 of a second group, first and second contact structures CT13 and CT23 of a third group, first and second contact structure CT14 and CT24 of a fourth group, and first and second contact structures CT15 and CT25 of a fifth group.

In an embodiment, the semiconductor memory device may include first to tenth bit lines BL1 to BL10. The first to tenth bit lines BL1 to BL10 may extend in parallel to each other and may be arranged to be spaced apart from each other in the second direction D2. The first to tenth bit lines BL1 to BL10 may overlap with the first opening OP11 of the first group, the first opening OP12 of the second group, the first opening OP13 of the third group, the first opening OP14 of the fourth group, and the first opening OP15 of the fifth group. Bit lines that are disposed consecutively may overlap with each of the peripheral-circuit-side first and second pad patterns PP11 and PP21 of the first group, the peripheral-circuit-side first and second pad patterns PP12 and PP22 of the second group, the peripheral-circuit-side first and second pad patterns PP13 and PP23 of the third group, the peripheral-circuit-side first and second pad patterns PP14 and PP24 of the fourth group, and the peripheral-circuit-side first and second pad patterns PP15 and PP25 of the fifth group.

Referring to FIG. 5A, the first bit line BL1, the second bit line BL2, the third bit line BL3, the fourth bit line BL4, and the fifth bit line BL5, which are consecutively arranged in the second direction D2, may overlap with the peripheral-circuit-side first pad pattern PP11 of the first group. The fifth bit line BL5 may be connected to the peripheral-circuit-side first pad pattern PP11 of the first group via the first contact pattern CT11 of the first group.

The sixth bit line BL6, the seventh bit line BL7, the eighth bit line BL8, the ninth bit line BL9, and the tenth bit line BL10, which are consecutively arranged in the second direction D2, may overlap with the peripheral-circuit-side second pad pattern PP21 of the first group. The tenth bit line BL10 may be connected to the peripheral-circuit-side second pad pattern PP21 of the first group via the second contact pattern CT21 of the first group.

Referring to FIG. 5B, the second bit line BL2, the third bit line BL3, the fourth bit line BL4, the fifth bit line BL5, and the sixth bit line BL6 may overlap with the peripheral-circuit-side first pad pattern PP12 of the second group. The fourth bit line BL4 may be connected to the peripheral-circuit-side first pad pattern PP12 of the second group via the first contact pattern CT12 of the second group.

The seventh bit line BL7, the eighth bit line BL8, the ninth bit line BL9, and the tenth bit line BL10 may overlap with the peripheral-circuit-side second pad pattern PP22 of the second group. The ninth bit line BL9 may be connected to the peripheral-circuit-side second pad pattern PP22 of the second group via the second contact pattern CT22 of the second group.

Figure 5C:
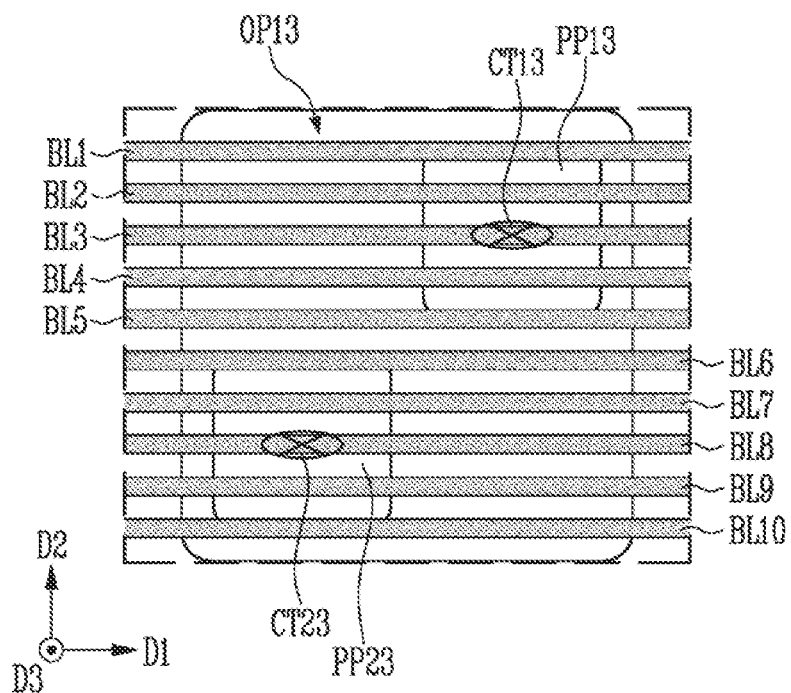

Referring to FIG. 5C, the first bit line BL1, the second bit line BL2, the third bit line BL3, the fourth bit line BL4, and the fifth bit line BL5 may overlap with the peripheral-circuit-side first pad pattern PP13 of the third group. The third bit line BL3 may be connected to the peripheral-circuit-side first pad pattern PP13 of the third group via the first contact pattern CT13 of the third group.

The sixth bit line BL6, the seventh bit line BL7, the eighth bit line BL8, the ninth bit line BL9, and the tenth bit line BL10 may overlap with the peripheral-circuit-side second pad pattern PP23 of the third group. The eighth bit line BL8 may be connected to the peripheral-circuit-side second pad pattern PP23 of the third group via the second contact pattern CT23 of the third group.

Figure 5D:
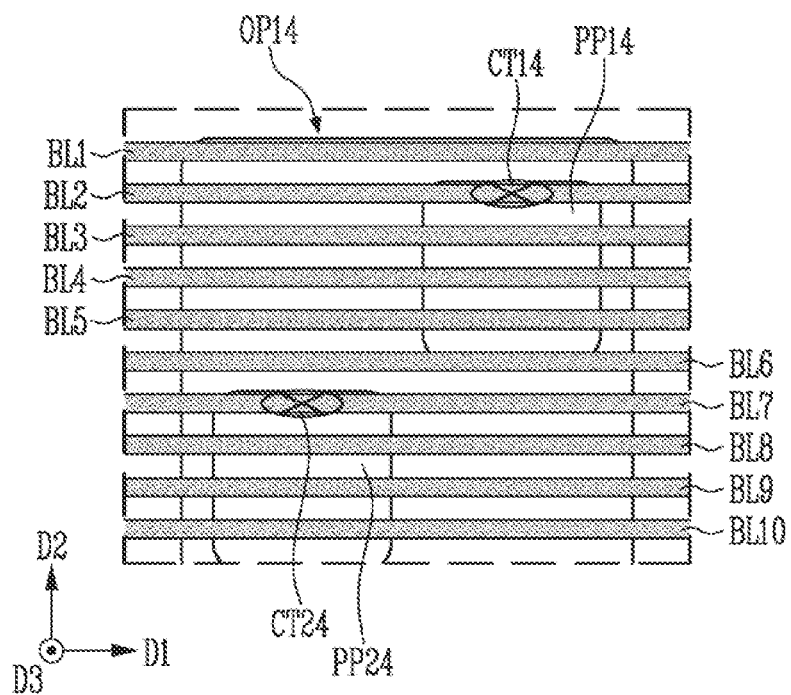

Referring to FIG. 5D, the second bit line BL2, the third bit line BL3, the fourth bit line BL4, the fifth bit line BL5, and the sixth bit line BL6 may overlap with the peripheral-circuit-side first pad pattern PP14 of the fourth group. The second bit line BL2 may be connected to the peripheral-circuit-side first pad pattern PP14 of the fourth group via the first contact pattern CT14 of the fourth group.

The seventh bit line BL7, the eighth bit line BL8, the ninth bit line BL9, and the tenth bit line BL10 may overlap with the peripheral-circuit-side second pad pattern PP24 of the fourth group. The seventh bit line BL7 may be connected to the peripheral-circuit-side second pad pattern PP24 of the fourth group via the second contact pattern CT24 of the fourth group.

Figure 5E:
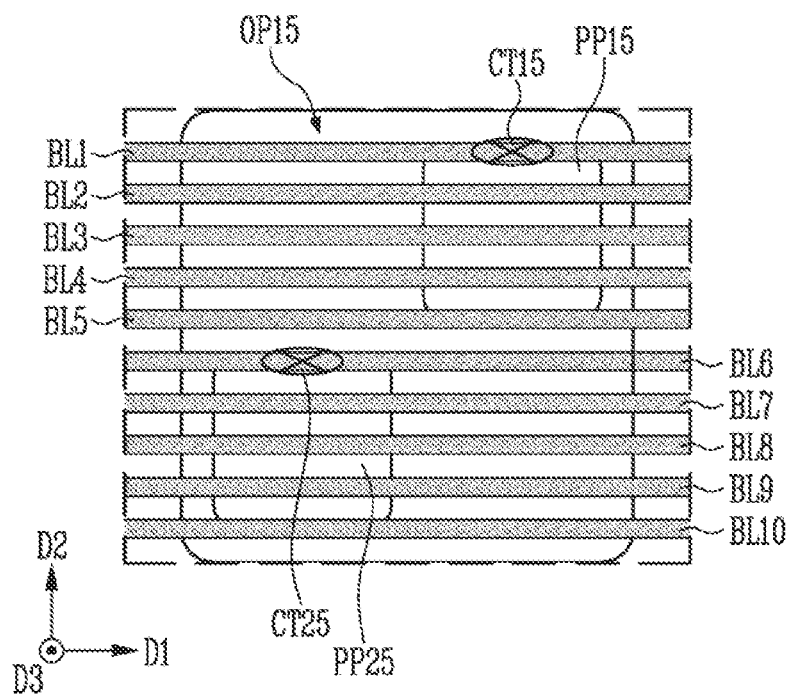

Referring to FIG. 5E, the first bit line BL1, the second bit line BL2, the third bit line BL3, the fourth bit line BL4, and the fifth bit line BL5 may overlap with the peripheral-circuit-side first pad pattern PP15 of the fifth group. The first bit line BL1 may be connected to the peripheral-circuit-side first pad pattern PP15 of the fifth group via the first contact pattern CT15 of the fifth group.

The sixth bit line BL6, the seventh bit line BL7, the eighth bit line BL8, the ninth bit line BL9, and the tenth bit line BL10 may overlap with the peripheral-circuit-side second pad pattern PP25 of the fifth group. The sixth bit line BL6 may be connected to the peripheral-circuit-side second pad pattern PP25 of the fifth group via the second contact pattern CT25 of the fifth group.

Figure 6:
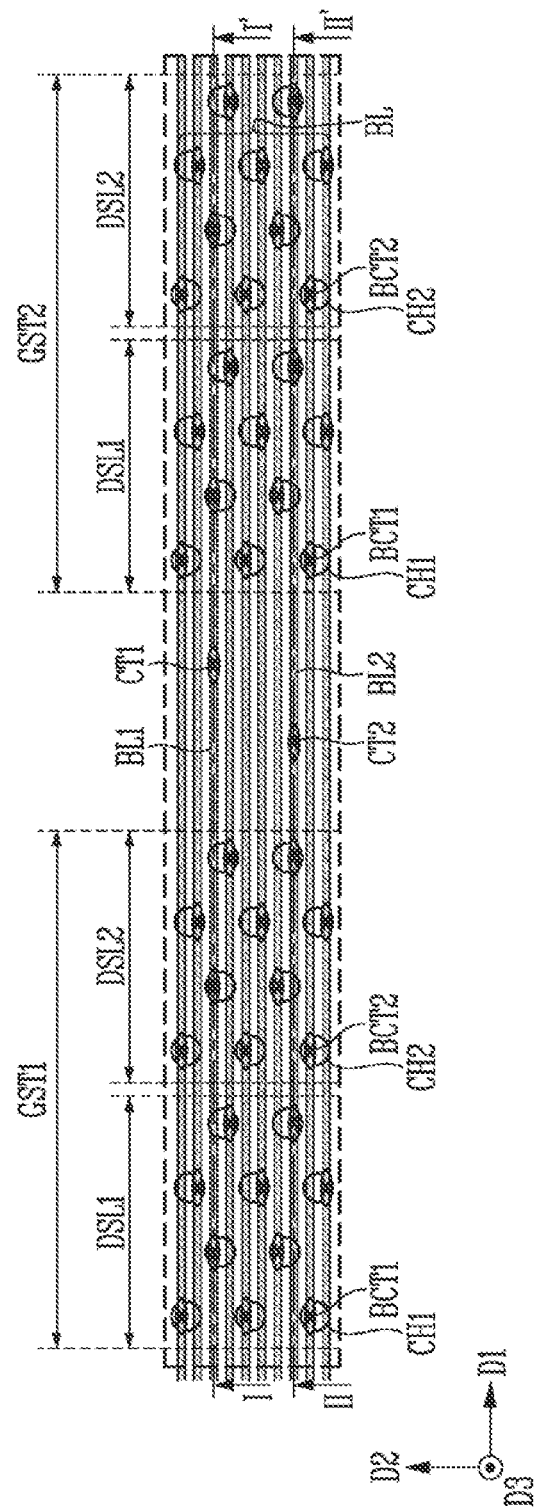
FIG. 6 is a plan view illustrating a semiconductor memory device in accordance with an embodiment of the present disclosure.

FIG. 6 is a plan view illustrating a semiconductor memory device in accordance with an embodiment of the present disclosure.

Referring to FIG. 6, the semiconductor memory device may include gate stack structures GST1 and GST2, channel pillars CH1 and CH2, and bit lines BL.

The gate stack structures GST1 and GST2 may include a first gate stack structure GST1 and a second gate stack structure GST2, which are spaced apart from each other. Each of the first gate stack structure GST1 and the second gate stack structure GST2 may extend on a plane that is created by the first direction D1 and the second direction D2. The first gate stack structure GST1 and the second gate stack structure GST2 may be spaced apart from each other in the first direction D1. Each of the first gate stack structure GST1 and the second gate stack structure GST2 may include a first drain select line DSL1 and a second drain select line DSL2, which are spaced apart from each other in the first direction D1.

Each of the first gate stack structure GST1 and the second gate stack structure GST2 may be penetrated by channel pillars CH1 and CH2 extending in a third direction D3. The channel pillars CH1 and CH2 may be connected to the bit lines BL via bit line contacts BCT1 and BCT2.

The channel pillars CH1 and CH2 may include a first channel pillar CH1 that penetrates the first drain select line DSL1 and a second channel pillar CH2 that penetrates the second drain select line DSL2. The bit line contacts BCT1 and BCT2 may include a first bit line contact BCT1 that is connected to the first channel pillar CH1 and a second bit line contact BCT2 that is connected to the second channel pillar CH2.

The bit lines BL may be parallel to each other. In an embodiment, each of the bit lines BL may extend in the first direction D1. The bit lines BL may be spaced apart in the second direction D2. The bit lines BL may include a first bit line BL1 that is connected to a first contact structure CT1 and a second bit line BL2 that is connected to a second contact structure CT2. The first contact structure CT1 and the second contact structure CT2 may be disposed between the first gate stack structure GST1 and the second gate stack structure GST2. The first contact structure CT1 and the second contact structure CT2 may extend in the third direction D3.

The first bit line BL1 and the second bit line BL2 may be connected to a page buffer group via the first contact structure CT1 and the second contact structure CT2. Hereinafter, a connection structure between the first and second bit lines BL1 and BL2 and the page buffer group will be described with reference to sectional views of the semiconductor memory device taken along lines I-I' and II-II'.

The first bit line BL1 may overlap with first channel pillars CH1 and second channel pillars CH2, which are arranged in a line in the first direction D1. Some of the first channel pillars CH1 and the second channel pillars CH2, which overlap with the first bit line BL1, may be connected to the first bit line BL1, and the others of the first channel pillars CH1 and the second channel pillars CH2 may be connected to another bit line. The second bit line BL2 may overlap with first channel pillars CH1 and second channel pillars CH2, which are arranged in a line in the first direction D1. Some of the first channel pillars CH1 and the second channel pillars CH2, which overlap with the second bit line BL2, may be connected to the second bit line BL2, and the others of the first channel pillars CH1 and the second channel pillars CH2 may be connected to another bit line.

The line I-I' may overlap with not only first and second channel pillars CH1 and CH2 that are connected to the first bit line BL1, but also first and second channel pillars CH1 and CH2 that are connected to another bit line. The line II-II' may overlap with not only first and second channel pillars CH1 and CH2 that are connected to the second bit line BL2, but also first and second channel pillars CH1 and CH2 that are connected to another bit line.

Figure 7A:
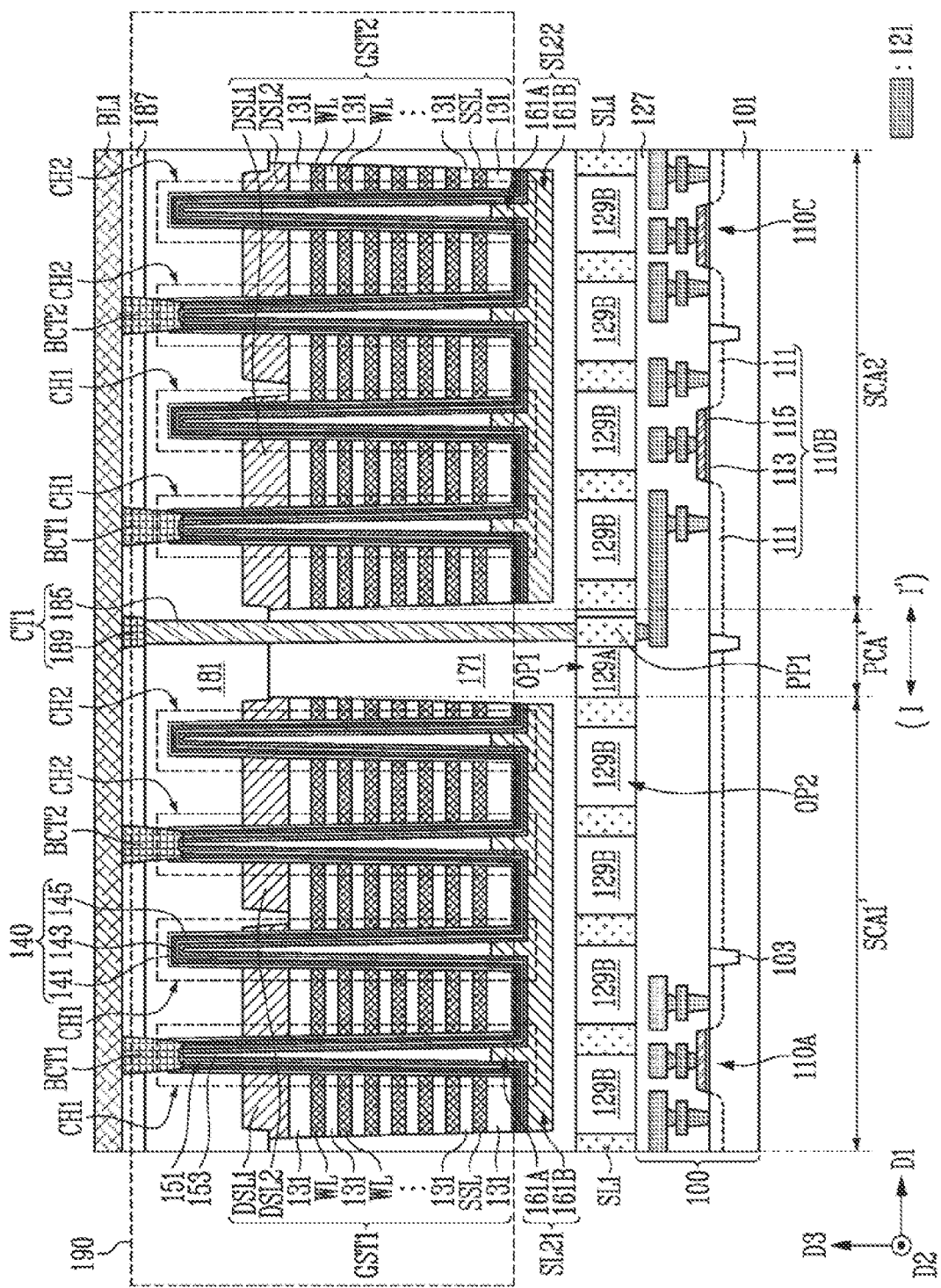
FIG. 7A is a sectional view of the semiconductor memory device taken along line I-I' shown in FIG. 6.
Figure 7B:
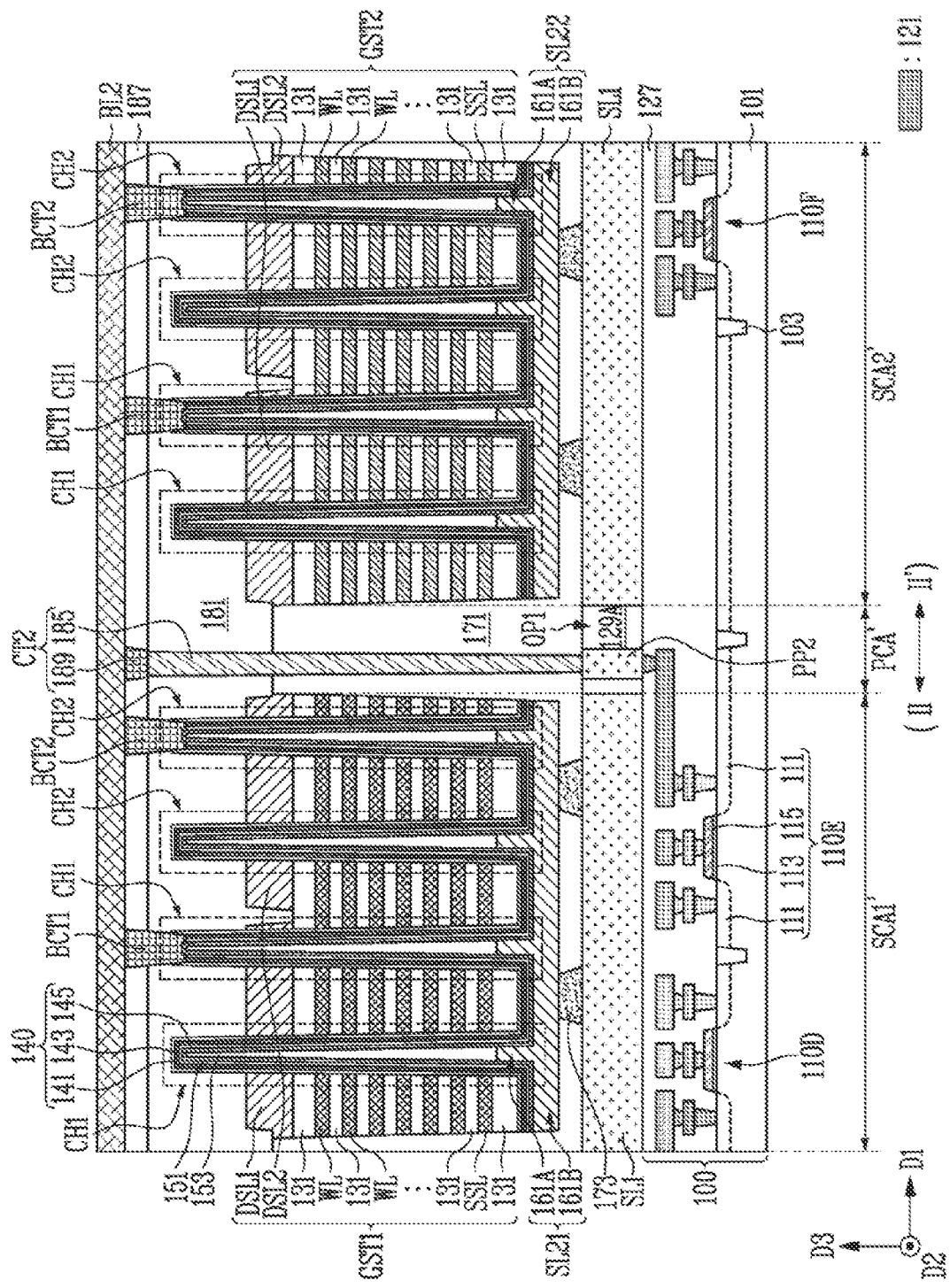
FIG. 7B is a sectional view of the semiconductor memory device taken along line II-II' shown in FIG. 6.

FIG. 7A is a sectional view of the semiconductor memory device taken along the line I-I' shown in FIG. 6, and FIG. 7B is a sectional view of the semiconductor memory device taken along the line II-II' shown in FIG. 6.

Referring to FIGS. 7A and 7B, the semiconductor memory device may include a peripheral circuit structure 100, a first source pattern SL1 disposed on the peripheral circuit structure 100, a memory cell array 190 disposed on the first source pattern SL1, second source patterns SL21 and SL22 between the memory cell array 190 and the first source pattern SL1, cell-array-side pad patterns 173 between the second source patterns SL21 and SL22 and the first source pattern SL1, a first bit line BL1 and a second bit line BL2, which are connected to the memory cell array 190, first and second bit line contacts BCT1 and BCT2, and first and second contact structures CT1 and CT2.

The peripheral circuit structure 100 may include transistors 110A, 110B, 110C, 110D, 110E, and 110F, constituting the page buffer group 37 that is shown in FIG. 1, and interconnections 121 that are connected to the transistors 110A, 110B, 110C, 110D, 110E, and 110F. Each of the transistors 110A, 110B, 110C, 110D, 110E, and 110F may include junctions 111 that are formed in a semiconductor substrate 101, a gate insulating layer 113 that is formed on the semiconductor substrate 101, and a gate electrode 115 that is formed on the gate insulating layer 113. The gate electrode 115 may be disposed on an active region of the semiconductor substrate 101, which is partitioned by isolation layers 103. The junctions 111 may be defined by injecting at least one of an n-type impurity and a p-type impurity into active regions at both sides of the gate electrode 115.

Each of the interconnections 121 may include two or more conductive patterns that are connected to each other.

The interconnections 121 that are connected to the transistors 110A, 110B, 110C, 110D, 110E, and 110F of the peripheral circuit structure 100 may be buried in a lower insulating structure 127. The lower insulating structure 127 may include two or more insulating layers.

The first source pattern SL1 may include a first source contact region SCA1' a second source contact region SCA2, and a page buffer connection region PCA'. The page buffer connection region PCA' may be disposed between the first source contact region SCA1' and the second source contact region SCA2'.

The first source pattern SL1 may be net-shape with a first opening OP1 and second openings OP2. FIG. 7A illustrates a section of the first source pattern SL1 that is taken along the line I-I' that overlaps with the first opening OP1 and the second openings OP2, and FIG. 7B illustrates a section of the first source pattern SL1 that is taken along the line II-II' that overlaps with the first opening OP1 and does not overlap with the second openings OP2. The first source pattern SL1 may be net-shaped as shown in FIG. 4. The first source pattern SL1 may continuously extend from the first source contact region SCA1' to the page buffer connection region PCA'. The first source pattern SL1 may continuously extend from the page buffer connection region PCA' to the second source contact region SCA2'. The first source pattern SL1 may be disposed between the first opening OP1 and a second opening OP2 that is adjacent to the first opening OP1 and between second openings OP2. In an embodiment, the first source contact region SCA1' and the second source contact region SCA2', which are shown in FIGS. 7A and 7B, may correspond to the first source contact region SCA1 and the second source contact region SCA2, which are shown in FIG. 4, and the page buffer connection region PCA' shown in FIGS. 7A and 7B may correspond to the second page buffer connection region PCA2 shown in FIG. 4.

The first opening OP1 may be filled with a peripheral-circuit-side first pad pattern PP1, a peripheral-circuit-side second pad pattern PP2, and a first insulating pattern 129A. The first source pattern SL1, the peripheral-circuit-side first pad pattern PP1, and the peripheral-circuit-side second pad pattern PP2 may be insulated from each other due to the first insulating pattern 129A. The second openings OP2 may be respectively filled with second insulating patterns 129B.

The first opening OP1 and the first insulating pattern 129A may penetrate the first source pattern SL1 in the page buffer connection region PCA'. The second openings OP2 and the second insulating patterns 129B may penetrate the first source pattern SL1 in each of the first source contact region SCA1' and the second source contact region SCA2'.

The peripheral-circuit-side first pad pattern PP1 and the peripheral-circuit-side second pad pattern PP2 may be disposed at substantially the same level as the first source pattern SL1. The peripheral-circuit-side first pad pattern PP1 and the peripheral-circuit-side second pad pattern PP2 may be made of the same conductive material as the first source pattern SL1. The peripheral-circuit-side first pad pattern PP1 and the peripheral-circuit-side second pad pattern PP2 may be buried by the first insulating pattern 129A in the first opening OP1. The peripheral-circuit-side first pad pattern PP1 and the peripheral-circuit-side second pad pattern PP2 may be arranged in a diagonal direction in the first opening OP1, in the plane view, as described with reference to FIG. 3. The peripheral-circuit-side first pad pattern PP1 and the peripheral-circuit-side second pad pattern PP2 may be connected to some of the transistors 110A, 110B, 110C, 110D, 110E, and 110F via some of the interconnections 121. In an embodiment, the peripheral-circuit-side first pad pattern PP1 may be connected to a first transistor 110B via interconnections 121, and the peripheral-circuit-side second pad pattern PP2 may be connected to a second transistor 110E via interconnections 121.

The memory cell array 190 may include a first gate stack structure GST1, a second gate stack structure GST2, first and second channel pillars CH1 and CH2 that penetrate each of the first and second gate stack structures GST1 and GST2, and a memory layer 140 that surrounds a sidewall of each of the first and second channel pillars CH1 and CH2.

The first gate stack structure GST1 and the second gate stack structure GST2 may respectively overlap with the first source contact region SCA1' and the second source contact region SCA2' of the first source pattern SL1. The first and second gate stack structures GST1 and GST2 may be respectively disposed on the second source patterns SL21 and SL22. The first and second gate stack structures GST1 and GST2 may include interlayer insulating layers 131 and conductive patterns SSL, WL, DSL1, and DSL2, which are alternately stacked on the second source patterns SL21 and SL22. The interlayer insulating layers 131 and the conductive patterns SSL, WL, DSL1, and DSL2 may surround a sidewall of the memory layer 140.

The first gate stack structure GST1 and the second gate stack structure GST2 may be separated from each other due to a gate insulating structure 171. The gate insulating structure 171 may be disposed between the first gate stack structure GST1 and the second gate stack structure GST2. The gate insulating structure 171 may extend between the second source patterns SL21 and SL22. The gate insulating structure 171 may extend between the second source patterns SL21 and SL22 and the first source pattern SL1.

At least one upper insulating layer may be disposed on the first gate stack structure GST1 and the second gate stack structure GST2. In an embodiment, a first upper insulating layer 181 and a second upper insulating layer 187 may be stacked on the first gate stack structure GST1 and the second gate stack structure GST2.

The conductive patterns SSL, WL, DSL1, and DSL2 of the first and second gate stack structures GST1 and GST2 may include a source select line SSL, word lines WL, a first drain select line DSL1, and a second drain select line DSL2. The arrangement of the source select line SSL, the word lines WL, the first drain select line DSL1, and the second drain select line DSL2 is the same as the arrangement that is described with reference to FIG. 3.

The word lines WL may be disposed between the first drain select line DSL1 and the source select line SSL and may extend between the second drain select line DSL2 and the source select line SSL.

The first upper insulating layer 181 may extend to fill a space between the first drain select line DSL1 and the second drain select line DSL2. The first drain select line DSL1 and the second drain select line DSL2 may be insulated from each other due to the first upper insulating layer 181.

Each of the first channel pillar CH1 and the second channel pillar CH2 may extend into the first upper insulating layer 181. Each of the first channel pillar CH1 and the second channel pillar CH2 may be configured with a channel layer 151 and a core insulating layer 153. The channel layer 151 may extend in the third direction D3 to penetrate each of the first and second gate stack structures GST1 and GST2. The channel layer 151 may extend between each of the second source patterns SL21 and SL22 and each of the first and second gate stack structures GST1 and GST2. For example, the channel layer 151 may extend between a second source pattern SL21 and the first gate stack structure GST1. The channel layer 151 may be connected to a second source pattern SL21 or SL22 that corresponds to the channel layer 151 and may extend toward the first and second bit lines BL1 and BL2. The channel layer 151 may surround a sidewall of the core insulating layer 153. The channel layer 151 may cover a surface of the core insulating layer 153, which faces the first bit line BL1 or the second bit line BL2.

The core insulating layer 153 may be disposed in a central region of each of the first channel pillar CH1 and the second channel pillar CH2.

The memory layer 140 may be disposed between each of the first and second gate stack structures GST1 and GST2 and the channel layer 151. The memory layer 140 may extend between the channel layer 151 and the first upper insulating layer 181. The memory layer 140 may include a blocking insulating layer 141, a data storage layer 143, and a tunnel insulating layer 145. The data storage layer 143 may be disposed between the blocking insulating layer 141 and the tunnel insulating layer 145, and the tunnel insulating layer 145 may be disposed between the blocking insulating layer 141 and the channel layer 151. The block insulating layer 141 may prevent a phenomenon in which charges are introduced into each of the source select line SSL, the word lines WL, the first drain select line DSL1, and the second drain select line DSL2. Each of partial regions of the data storage layer 143, which are surrounded by the word lines WL, may be used as a data storage region. In an embodiment, the data storage layer 143 may be configured as a material layer capable of storing data changed by using Fowler-Nordheim tunneling. The material layer may include a nitride layer in which charges can be trapped. The tunnel insulating layer 145 may include an insulating material through which charges can tunnel. In an embodiment, the tunnel insulating layer 145 may include a silicon oxide layer.

The second source patterns SL21 and SL22 may respectively overlap with the first source contact region SCA1' and the second source contact region SCA2' of the first source pattern SL1. Each of the second source patterns SL21 and SL22 may include a vertical part 161A and a horizontal part 161B. The horizontal part 161B may extend in parallel to the first source pattern SL1, and the vertical part 161A may extend toward the central region of each of the first channel pillar CH1 and the second channel pillar CH2 from the horizontal part 161B. The second source patterns SL21 and SL22 may include a doped semiconductor layer. In an embodiment, the second source patterns SL21 and SL22 may include an n-type doped silicon.

The cell-array-side pad patterns 173 may extend toward the first source pattern SL1 from the second source patterns SL21 and SL22. The cell-array-side pad patterns 173 may be bonded directly to the first source pattern SL1 in the first source contact region SCA1' and the second source contact SCA2'. The cell-array-side pad patterns 173 and the first source pattern SL1 may include a metal. The specific resistance of the first source pattern SL1 may be lower than those of the second source patterns SL21 and SL22. Accordingly, resistances of the second source patterns SL21 and SL22 may be compensated by the first source pattern SL1, and thus, the operational reliability of the semiconductor memory device may be improved. In an embodiment, the cell-array-side pad patterns 173 may include copper, and the first source pattern SL1 may include aluminum. Because the cell-array-side pad patterns 173 is bonded directly to the first source pattern SL1, which compensates for resistance, a bonding structure between the peripheral circuit structure 100 and the memory cell array 190 may be provided even when other bonding pads are not separately added on the first source pattern SL1.

The first bit line BL1 and the second bit line BL2 may be disposed on the second upper insulating layer 187. The first bit line BL1 and the second bit line BL2 may extend to overlap with the first opening OP1. The first bit line BL1 may overlap with the peripheral-circuit-side first pad pattern PP1. The second bit line BL2 may overlap with the peripheral-circuit-side second pad pattern PP2.

The first bit line contact BCT1 may connect the first bit line BL1 to the channel layer 151 of the first channel pillar CH1. The second bit line contact BCT2 may connect the second bit line BL2 to the channel layer 151 of the second channel pillar CH2. The first and second bit line contacts BCT1 and BCT2 may extend into the first and second upper insulating layers 181 and 187, and may penetrate the memory layer 140 to be connected to the channel layer 151.

The first opening OP1 of the first source pattern SL1 may include a region, which does not overlap with the first gate stack structure GST1 and the second gate stack structure GST2. The peripheral-circuit-side first pad pattern PP1 and the peripheral-circuit-side second pad pattern PP2 may be disposed in the first opening OP1 to avoid overlapping with the first gate stack structure GST1 and the second gate stack structure GST2.

The first contact structure CT1 and the second contact structure CT2 may penetrate the gate insulating structure 171 between the first gate stack structure GST1 and the second gate stack structure GST2. The first contact structure CT1 and the second contact structure CT2 may penetrate the first and second upper insulating layers 181 and 187. The first contact structure CT1 may extend toward the first bit line BL1 from the peripheral-circuit-side first pad pattern PP1. The second contact structure CT2 may extend toward the second bit line BL2 from the peripheral-circuit-side second pad pattern PP2.

Each of the first and second contact structures CT1 and CT2 may include a first conductive plug 185 and a second conductive plug 189. The first conductive plug 185 may penetrate the gate insulating structure 171 and the first upper insulating layer 181, and may extend in the third direction D3. The second conductive plug 189 may penetrate the second upper insulating layer 187.

A process of forming the peripheral circuit structure 100 and a process of forming the memory cell array 190 are not consecutive, but may be individually performed. Accordingly, heat that is generated in the process of forming the memory cell array 190 has no influence on the peripheral circuit structure 100, and thus, a defect of the semiconductor memory device due to heat may be reduced. A manufacturing method of the semiconductor memory device in accordance with an embodiment of the present disclosure will be described with reference to the accompanying drawings.

FIG. 8 is a sectional view illustrating a process of forming a peripheral circuit structure in accordance with an embodiment of the present disclosure.

Referring to FIG. 8, the peripheral circuit structure 200 may include transistors 210A, 210B, and 210C, constituting the page buffer group 37 that is shown in FIG. 1, and the peripheral circuit structure 200 may include interconnections 221 that are connected to the transistors 210A, 210B, and 210C. Each of the transistors 210A, 210B, and 210C may include junctions 211, a gate insulating layer 213, and a gate electrode 215.

The process of forming the peripheral circuit structure 200 may include forming isolation layers 203 in a semiconductor substrate 201, forming the transistors 210A, 210B, and 210C, and forming the interconnections 221.

The transistors 210A, 210B, and 210C may be disposed in active regions that are defined in the semiconductor substrate 201. The active regions may be partitioned by the isolation layers 203. The process of forming the transistors 210A, 210B, and 210C may include forming the gate insulating layer 213 and the gate electrode 215 on the semiconductor substrate 201 and forming the junctions 211 in the active regions of the semiconductor substrate 201. The junctions 211 may be formed by injecting at least one of an n-type impurity and a p-type impurity into active regions at both sides of the gate electrode 215.

The transistors 210A, 210B, and 210C and the semiconductor substrate 201 may be covered by a lower insulating structure 227. The lower insulating structure 227 may include two or more insulating layers that are stacked on the semiconductor substrate 201.

The interconnections 221 may be connected to the transistors 210A, 210B, and 210C of the page buffer group. The interconnections 221 may be buried in the lower insulating structure 227. Each of the interconnections 221 may include two or more conductive patterns that are connected to each other.

Figure 9A:
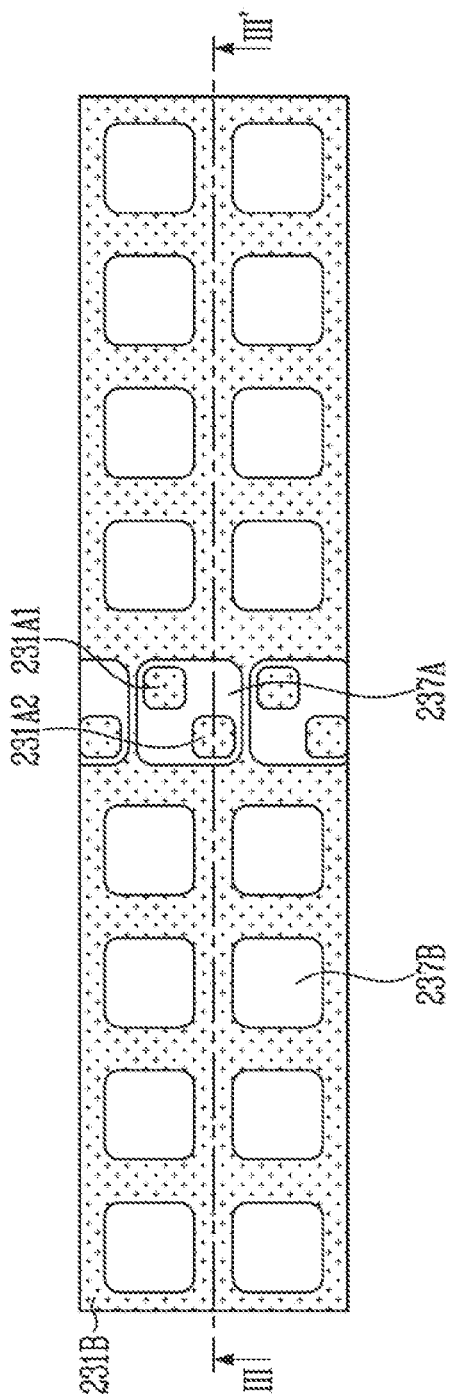
FIGS. 9A and 9B are plan and sectional views illustrating a process of forming a metal pattern group in accordance with an embodiment of the present disclosure.
Figure 9B:
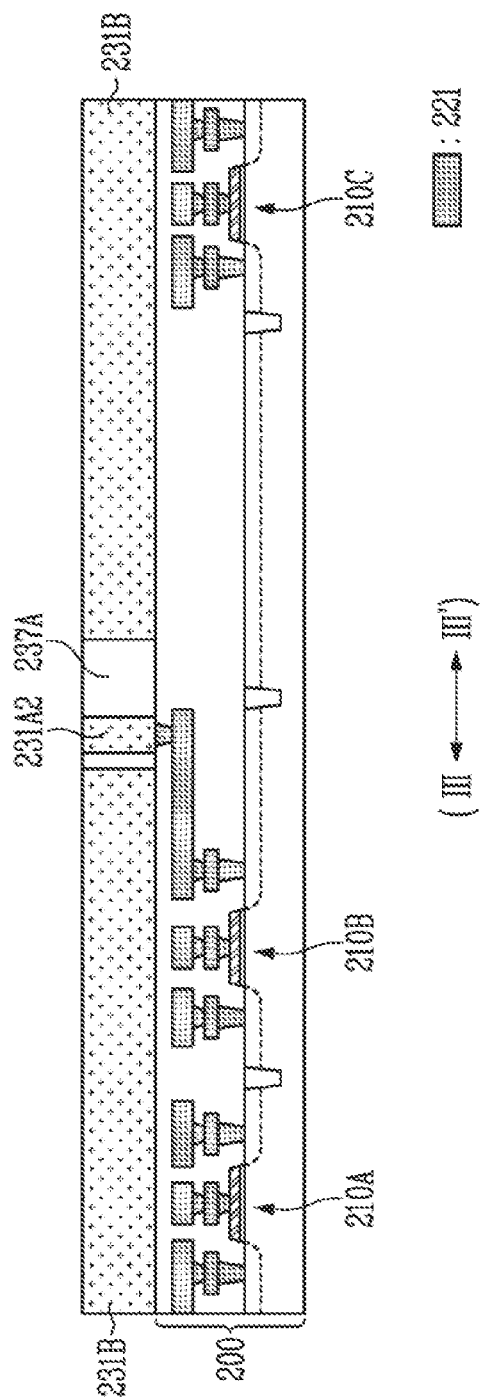

FIGS. 9A and 9B are plan and sectional views illustrating a process of forming a metal pattern group in accordance with an embodiment of the present disclosure.

Referring to FIGS. 9A and 9B, the metal pattern group may include peripheral-circuit-side pad patterns 231A1 and 231A2 and a first source pattern 231B. The peripheral-circuit-side pad patterns 231A1 and 231A2 and the first source pattern 231B may be formed on the peripheral circuit structure 200.

FIG. 9A is a plane view of the metal pattern group.

Referring to FIG. 9A, the first source pattern 231B of the metal pattern group may be net-shaped, penetrated by a plurality of first insulating patterns 237A and a plurality of second insulating pattern 237B. The peripheral-circuit-side pad patterns 231A1 and 231A2 of the metal pattern group may include a peripheral-circuit-side first pad pattern 231A1 and a peripheral-circuit-side second pad pattern 231A2, which are disposed in each of the first insulating patterns 237A.

The peripheral-circuit-side first pad pattern 231A1 and the peripheral-circuit-side second pad pattern 231A2 of the metal pattern group may be formed simultaneously with the first source pattern 231B. In an embodiment, the first source pattern 231B, the peripheral-circuit-side first pad pattern 231A1, and the peripheral-circuit-side second pad pattern 231A2 may be formed by etching a metal layer, using a single mask process. Regions in which the metal layer is etched may be respectively filled with the first insulating patterns 237A and the second insulating patterns 237B.

The first insulating patterns 237A and the second insulating patterns 237B may be planarized through a planarization process such as chemical mechanical polishing. Stress that is applied in the planarization process may be distributed through the first source pattern 231B that is net-shaped. Accordingly, when the first source pattern is net-shaped, cracks of a pattern due to the stress that occurs in the planarization process may be reduced as compared to the same situation with a first source pattern that is flat-shaped. Further, when the first source pattern is net-shaped, a delamination phenomenon may be reduced as compared with when the first source pattern is formed in a flat shape. In addition, the peripheral-circuit-side first pad pattern 231A1 and the peripheral-circuit-side second pad pattern 231A2 are disposed in an opening of the first source pattern 231B, and thus, an area that is occupied by the peripheral-circuit-side first pad pattern 231A1 and the peripheral-circuit-side second pad pattern 231A2 may be reduced.

The peripheral-circuit-side first pad pattern 231A1 and the peripheral-circuit-side second pad pattern 231A2 may be connected to the peripheral circuit structure.

FIG. 9B is a sectional view taken along line III-III' shown in FIG. 9A.

FIG. 9B illustrates the peripheral-circuit-side second pad pattern 231A2 connected to the peripheral circuit structure 200.

Referring to FIG. 9B, the peripheral-circuit-side second pad pattern 231A2 may be connected to one (e.g., 210B) of the transistors 210A, 210B, and 210C of the peripheral circuit structure 200 via the interconnection 221.

FIGS. 10A to 10D are process sectional views illustrating a process of forming a preliminary memory structure in accordance with an embodiment of the present disclosure.

Figure 10A:
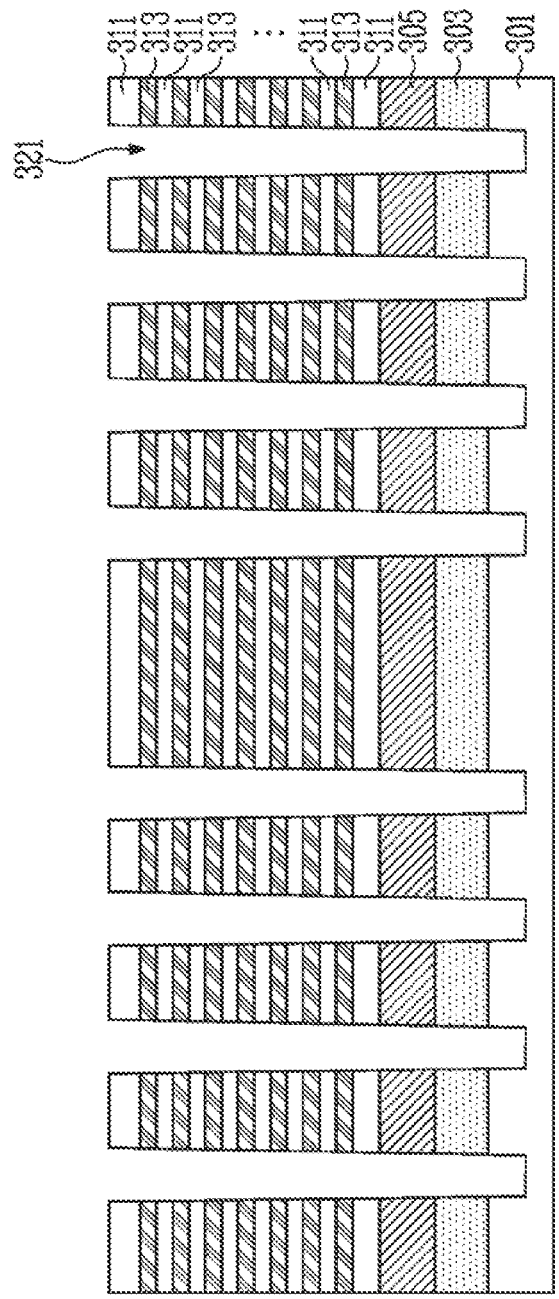

Referring to FIG. 10A, an etch stop layer 303 may be formed on a substrate 301. The substrate 301 may be made of silicon. The etch stop layer 303 may include a material with an etch selectivity with respect to the substrate 301. In an embodiment, the etch stop layer 303 may include a silicon nitride layer.

Subsequently, a select gate layer 305 may be formed on the etch stop layer 303. The select gate layer 305 may be formed of various conductive materials. In an embodiment, the select gate layer 305 may include doped silicon.

Subsequently, first material layers 311 and second material layers 313 may be alternately stacked on the select gate layer 305. In an embodiment, the second material layers 313 may be sacrificial layers with an etch selectivity with respect to the first material layers 311. More specifically, the first material layers 311 may be configured with a silicon oxide layer, and the second material layers 313 may be configured with a silicon nitride layer. The following processes are described based on an embodiment in which the first material layers 311 is configured with a silicon oxide layer and the second material layers 313 is configured with a silicon nitride layer, but the embodiment of the present disclosure is not limited thereto. In another embodiment, the first material layers 311 may be configured with an insulating layer, and the second material layers 313 may be configured with a conductive layer.

Subsequently, channel holes 321 may be formed, penetrating the first material layers 311 and the second material layers 313. The channel holes 321 may penetrate the select gate layer 305 and the etch stop layer 303, and extend into the substrate 301.

Figure 10B:
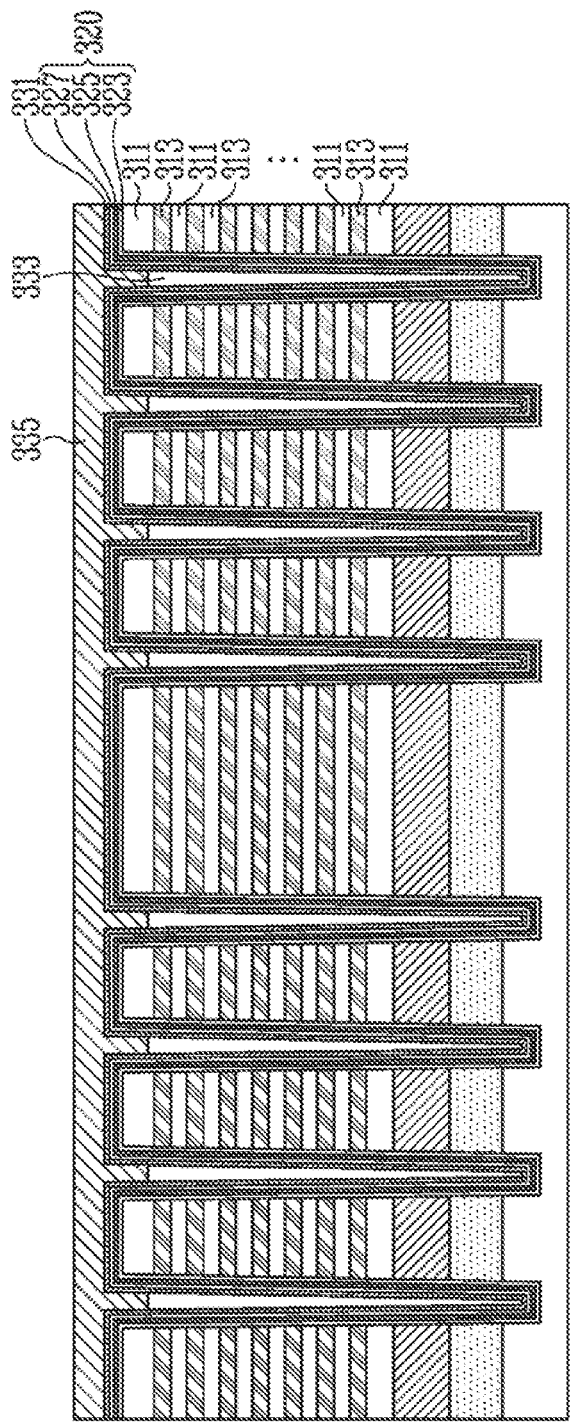

Referring to FIG. 10B, a memory layer 320, a channel layer 331, and a core insulating layer 333 may be formed in the channel holes 321 shown in FIG. 10A.

The process of forming the memory layer 320 may include forming a blocking insulating layer 323 on a surface of each of the channel holes 321 that is shown in FIG. 10A, forming a data storage layer 325 on the blocking insulating layer 323, and forming a tunnel insulating layer 327 on the data storage layer 325. Material layers that constitute the blocking insulating layer 323, the data storage layer 325, and the tunnel insulating layer 327 may correspond to the blocking insulating layer 141, the data storage layer 143, and the tunnel insulating layer 145, which are described with reference to FIGS. 7A and 7B. Each of the blocking insulating layer 323, the data storage layer 325, and the tunnel insulating layer 327 may extend onto a stack structure of the first material layers 311 and the second material layers 313.

The channel layer 331 may extend along a surface of the memory layer 320. The channel layer 331 may be configured as a semiconductor layer. In an embodiment, the channel layer 331 may include silicon.

The core insulating layer 333 may be formed on the channel layer 331. The core insulating layer 333 may be formed to a height at which an upper end of each of the channel holes 321, shown in FIG. 10A, is opened.

Subsequently, a doped semiconductor layer 335 may be formed. The doped semiconductor layer 335 may be connected to a portion of the channel layer 331, which is exposed by the core insulating layer 333, and extend onto the stack structure of the first material layers 311 and the second material layers 313. In an embodiment, the doped semiconductor layer 335 may be configured as an n-type doped silicon layer.

Referring to FIG. 10C, a first slit 341 may be formed, which penetrates the doped semiconductor layer 335, shown in FIG. 10B, and the stack structure of the first material layers 311 and the second material layers 313, shown in FIG. 10B. While the first slit 341 is being formed, the select gate layer 305 may serve as an etch stop layer. The doped semiconductor layer 335, shown in FIG. 10B, may be separated into second source patterns 335S due to the first slit 341.

Subsequently, the second material layers 313, shown in FIG. 10B, may be selectively removed through the first slit 341. Accordingly, horizontal spaces 343, between the first material layers 311, may be opened. The first material layers 311 may remain as interlayer insulating layers.

Figure 10D:
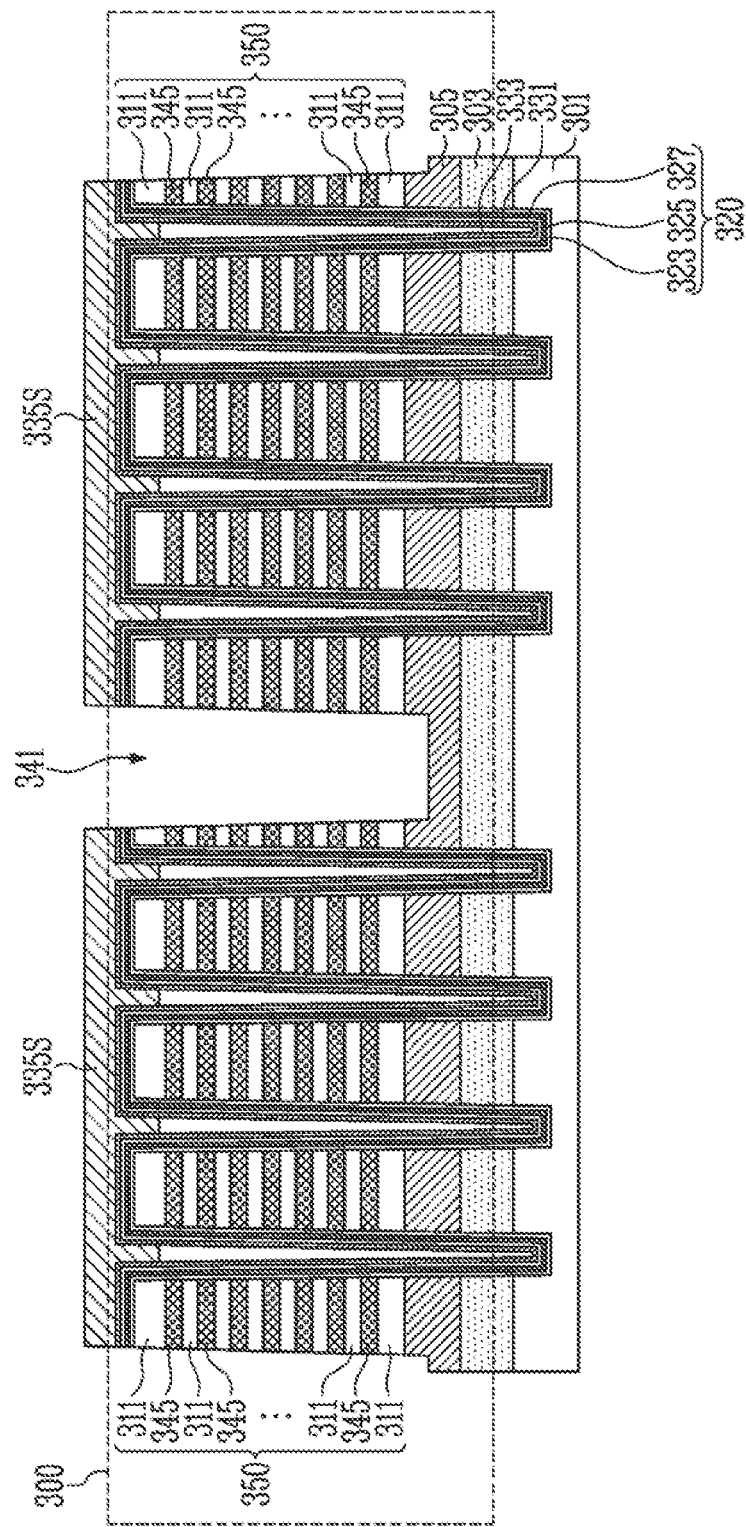

Referring to FIG. 10D, the horizontal spaces 343 shown in FIG. 10C may be filled with conductive patterns 345. Accordingly, preliminary gate stack structures 350 may be formed, which include the first material layers 311 and conductive patterns 345 that are alternately stacked. The preliminary gate stack structures 350 may be separated from each other due to the first slit 341.

A preliminary memory structure 300, defined through the processes that are described above with reference to FIGS. 10A to 10D, may include the select gate layer 305 that is formed on the substrate 301, the preliminary gate stack structure 350 that is formed on the select gate layer 305, the channel layer 331, and the memory layer 320. The channel layer 331 of the preliminary memory structure 300 may penetrate the preliminary gate stack structure 350 and the select gate layer 305, and extend into the substrate 301. The memory layer 320 of the preliminary memory structure 300 may be disposed between the channel layer 331 and the preliminary gate stack structure 350, and may extend between the channel layer 331 and the substrate 301.

The channel layer 331 of the preliminary memory structure 300 may be connected to the second source pattern 335S.

FIG. 11 is a sectional view illustrating a method of forming cell-array-side pad patterns in accordance with an embodiment of the present disclosure.

Referring to FIG. 11, the first slit 341 that is shown in FIG. 10D may be filled with a gate insulating structure 351. The gate insulating structure 351 may extend onto the second source patterns 335S.

Subsequently, cell-array-side pad patterns 353 may be formed, which are connected to each of the second source patterns 335S. The cell-array-side pad patterns 353 may penetrate the gate insulating structure 351. The cell-array-side pad patterns 353 may include a bonding metal. In an embodiment, the cell-array-side pad patterns 353 may include copper.

FIGS. 12A to 12F are process sectional views illustrating an embodiment of subsequent processes continued after the cell-array-side pad patterns are formed.

Figure 12A:
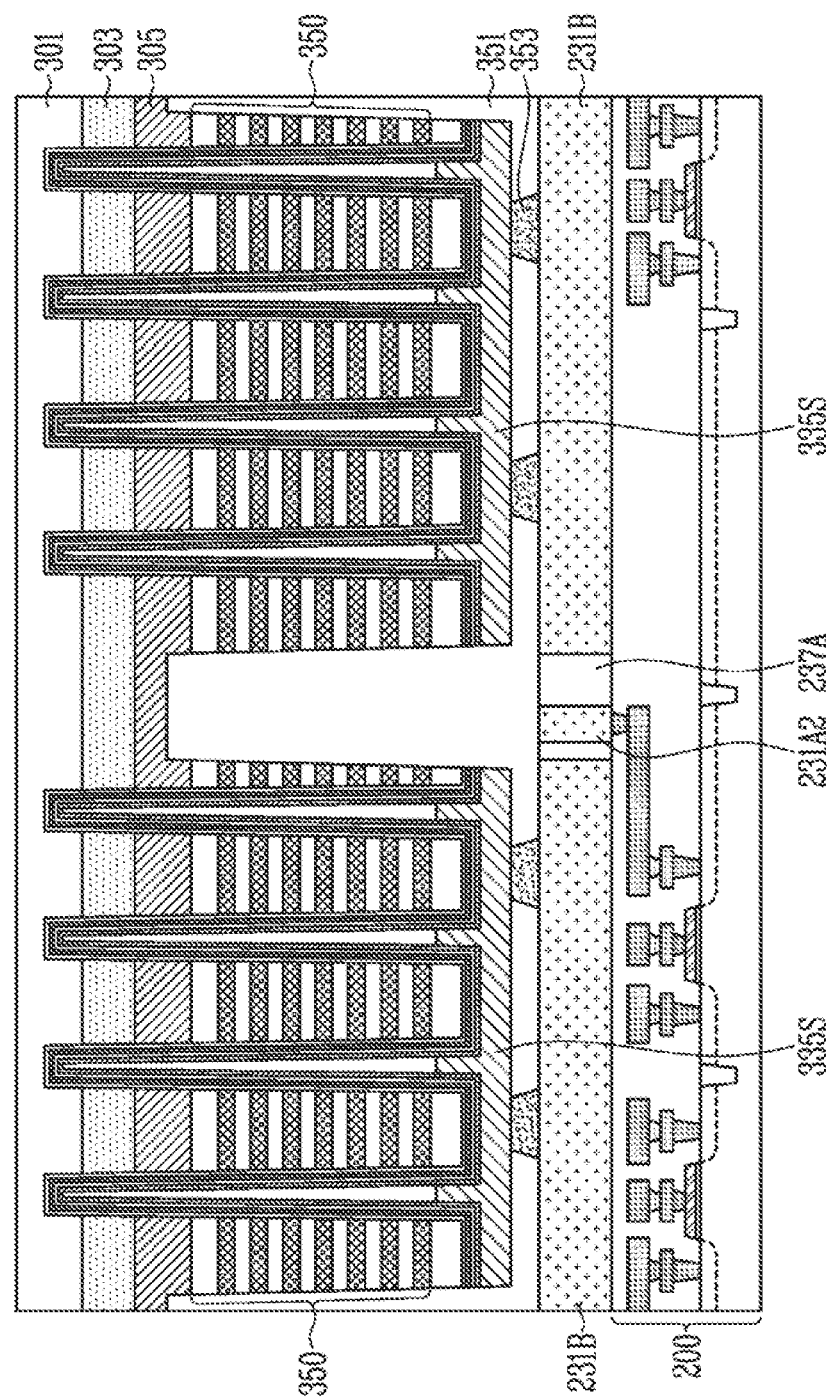
FIGS. 12A to 12F are process sectional views illustrating an embodiment of subsequent processes continued after the cell-array-side pad patterns are formed.

Referring to FIG. 12A, the cell-array-side pad patterns 353 may be bonded to the first source pattern 231B on the peripheral circuit structure 200, provided through the processes that are described with reference to FIGS. 8, 9A, and 9B. The process of bonding the cell-array-side pad patterns 353 to the first source pattern 231B may include aligning the preliminary gate stack structure 350 and the second source patterns 335S to avoid overlapping with the first insulating pattern 237A, the peripheral-circuit-side second pad pattern 231A2, and the peripheral-circuit-side first pad pattern 231A1, shown in FIG. 9A.

Figure 12B:
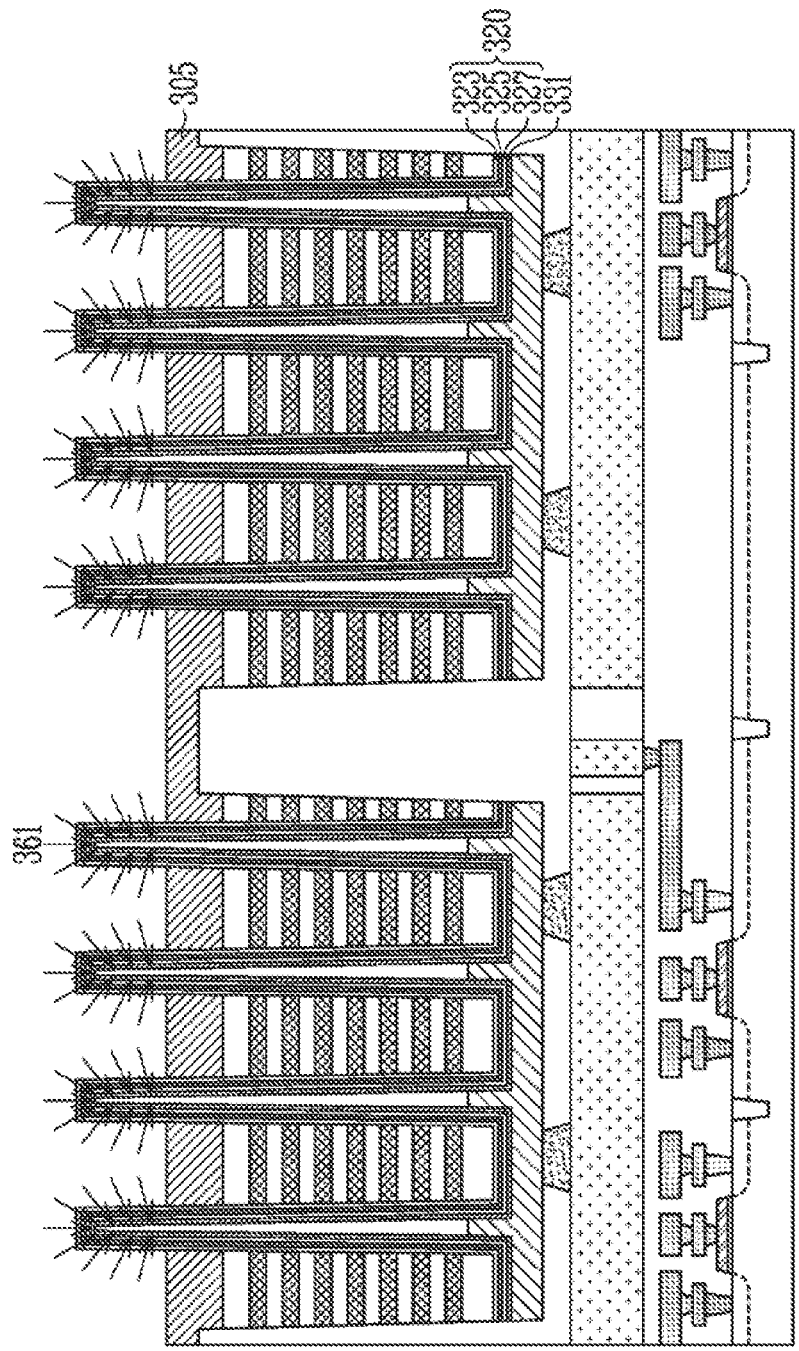

Referring to FIG. 12B, the substrate 301 that is shown in FIG. 12A may be selectively removed. While the substrate 301 is being removed, the select gate layer 305 may be protected by the etch stop layer 303 shown in FIG. 12A. Subsequently, the etch stop layer 303 shown in FIG. 12A may be selectively removed. Accordingly, a portion of the memory layer 320 may be exposed.

Subsequently, an impurity 361 may be injected into an end portion of the channel layer 331 covered by the exposed portion of the memory layer 320. In an embodiment, the impurity 361 may be an n-type impurity.

Figure 12C:
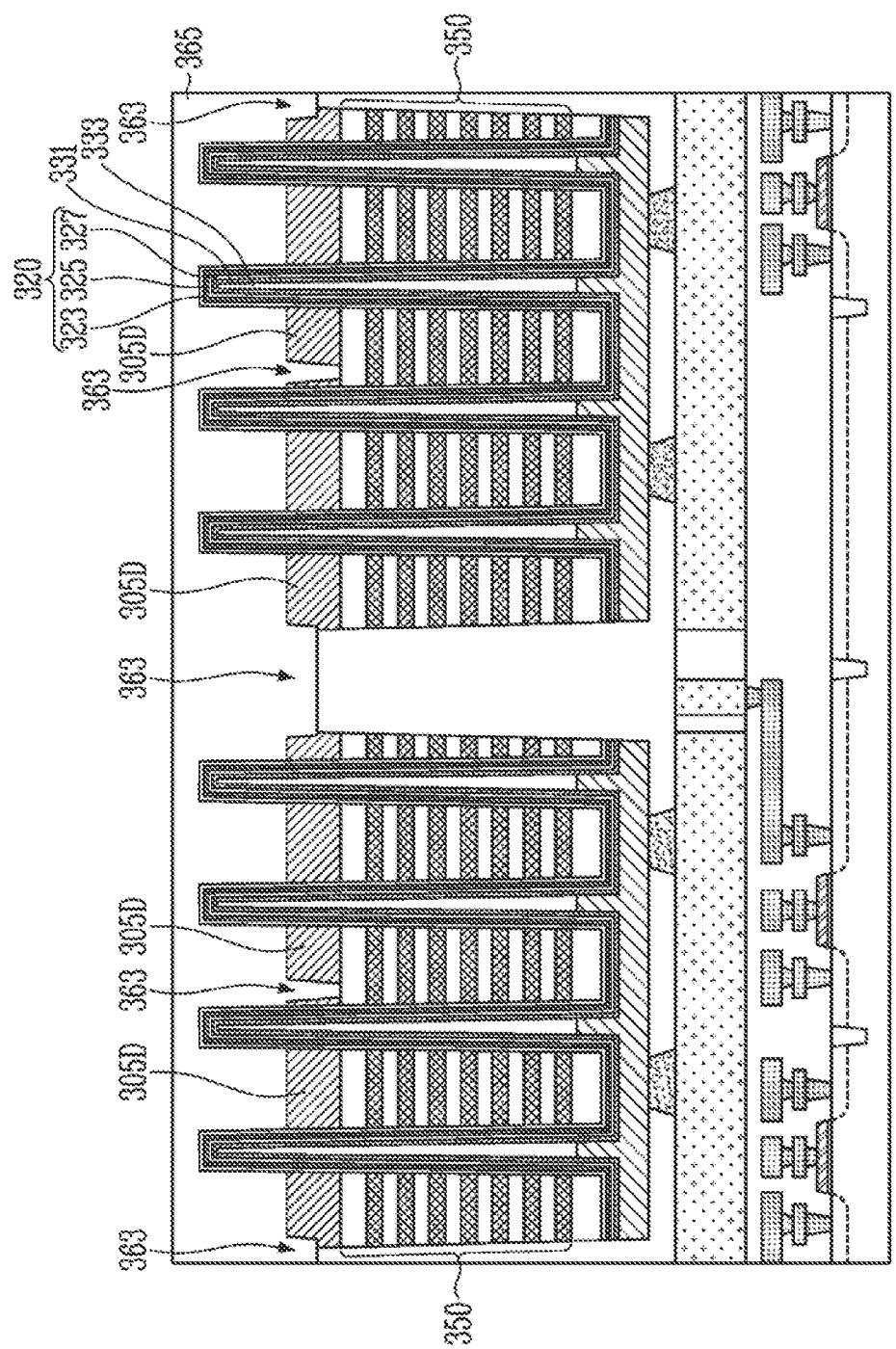

Referring to FIG. 12C, second slits 363 may be formed by etching the select gate layer 305 shown in FIG. 12B. The second slits 363 may penetrate the select gate layer 305 shown in FIG. 12B. The select gate layer 305 shown in FIG. 12B may be separated into drain select lines 305D due to the second slits 363.

Two or more drain select lines 305D may overlap with each of the preliminary gate stack structures 350. Each of the drain select lines 305D may remain to surround a sidewall of the channel layer 331 and a sidewall of the memory layer 320.

Subsequently, a first upper insulating layer 365 may be formed, which covers the drain select lines 305D and the memory layer 320. The first upper insulating layer 365 may fill the second slits 363.

Figure 12D:
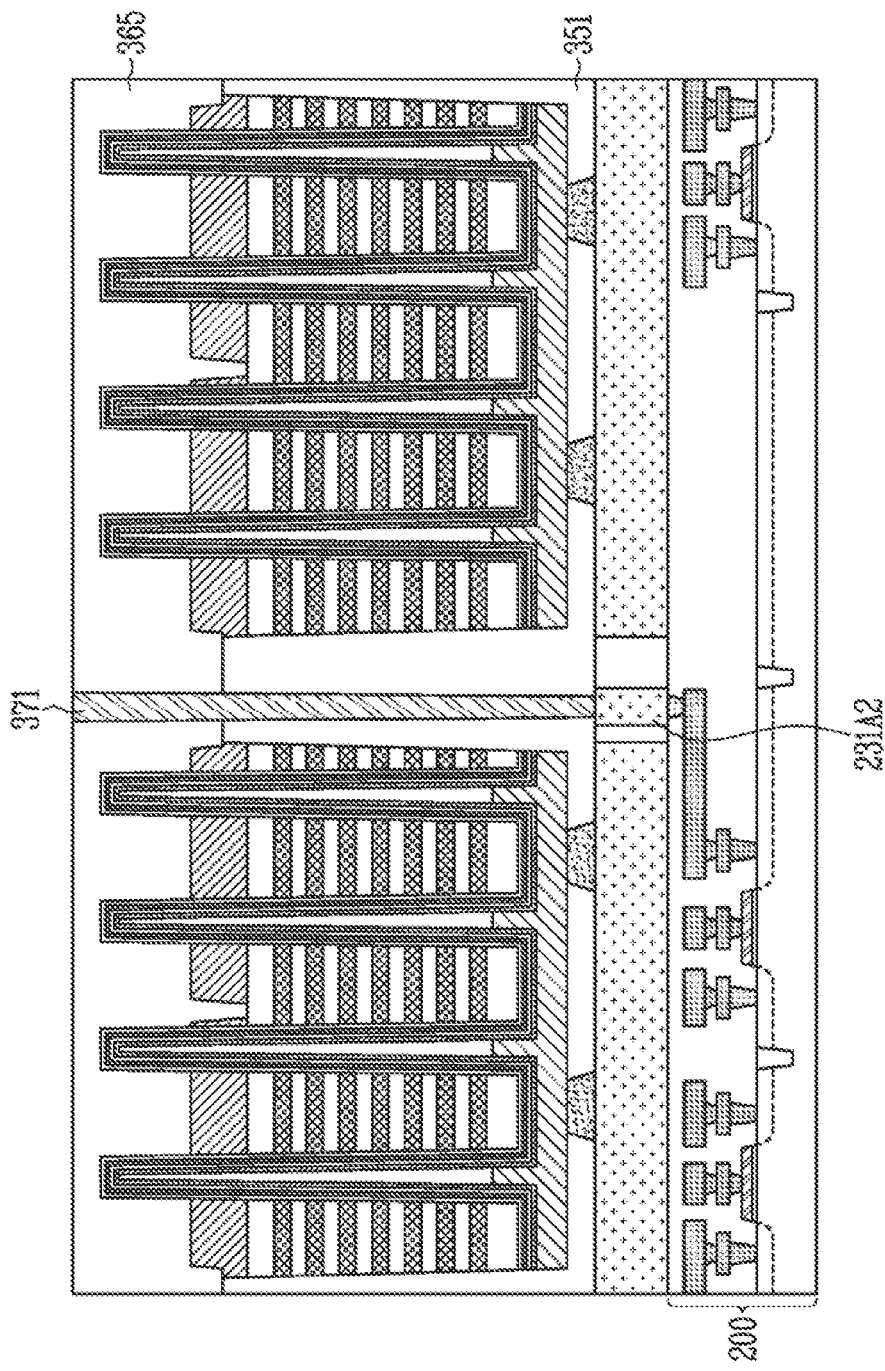

Referring to FIG. 12D, a first conductive plug 371 may be formed, penetrating the first upper insulating layer 365 and the gate insulating structure 351. The first conductive plug 371 may be connected to the peripheral-circuit-side second pad pattern 231A2. Although not shown in the drawing, a conductive plug that is connected to the peripheral-circuit-side first pad pattern 231A1, shown in FIG. 9A, may be formed simultaneously with the first conductive plug 371.

Figure 12E:
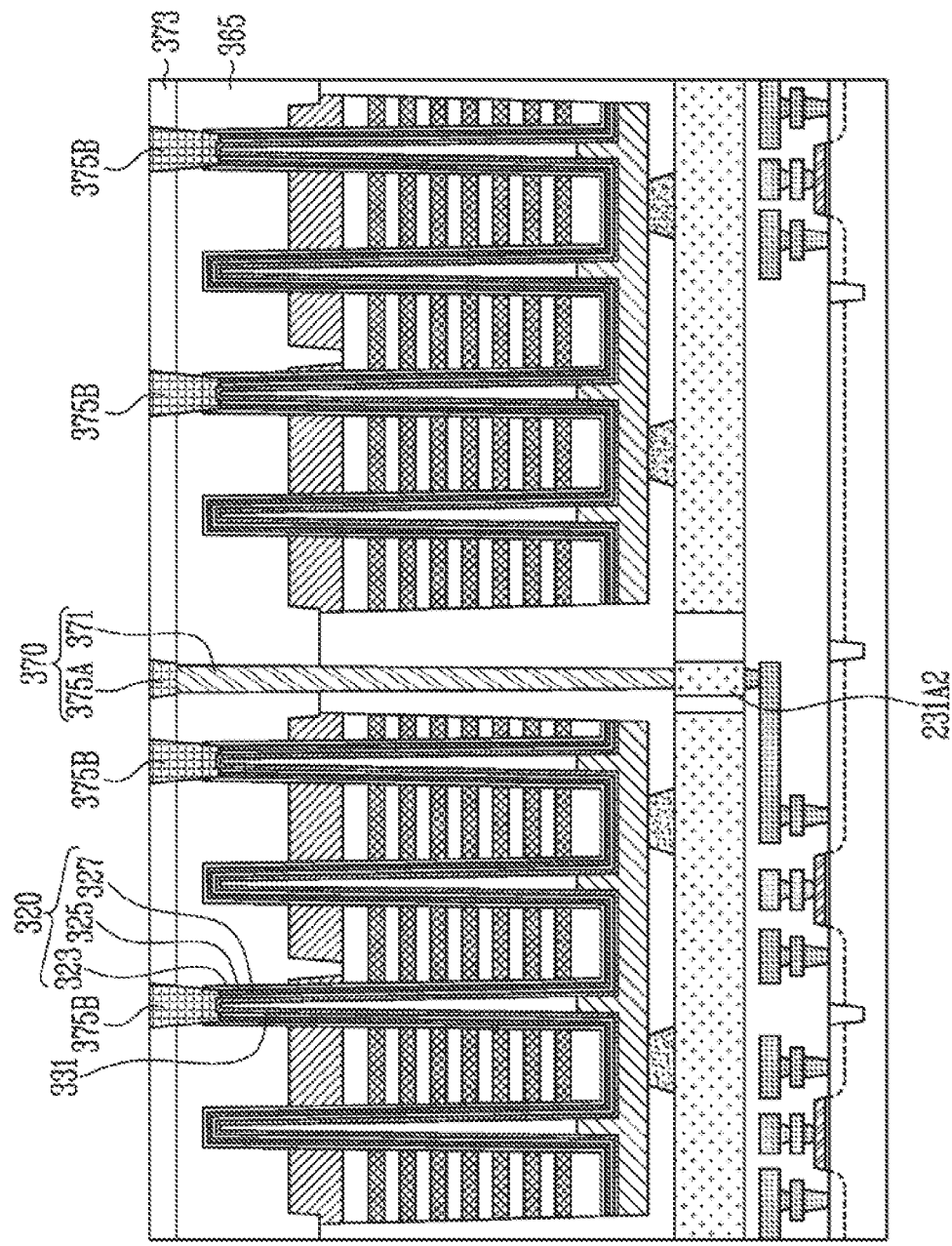

Referring to FIG. 12E, a second upper insulating layer 373 may be formed on the first upper Insulating layer 365. Subsequently, a second conductive plug 375A and bit line contacts 375B may be formed.

The second conductive plug 375A may penetrate the second upper insulating layer 373 and may be connected to the first conductive plug 371. Accordingly, a contact structure 370 that is connected to the peripheral-circuit-side second pad pattern 231A2 may be defined.

Each of the bit line contacts 375B may be connected to the channel layer 331 while penetrating the second upper insulating layer 373, the first upper insulating layer 365, and the memory layer 320.

Figure 12F:
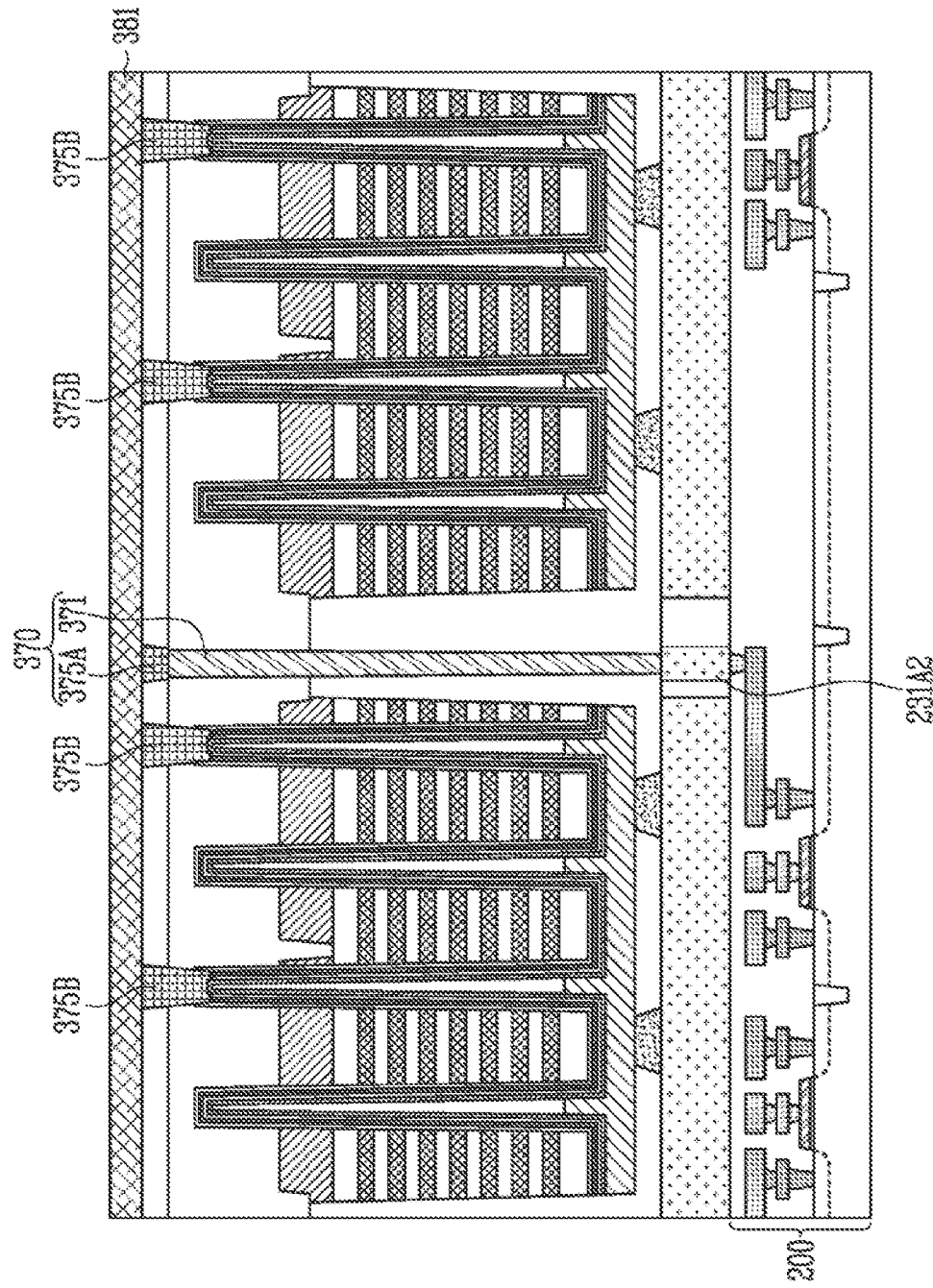

Referring to FIG. 12F, a bit line 381 may be formed, which is connected to the bit line contacts 375B. The bit line 381 may be connected to the peripheral circuit structure 200 via the contact structure 370 and the peripheral-circuit-side second pad pattern 231A2.

Figure 13:
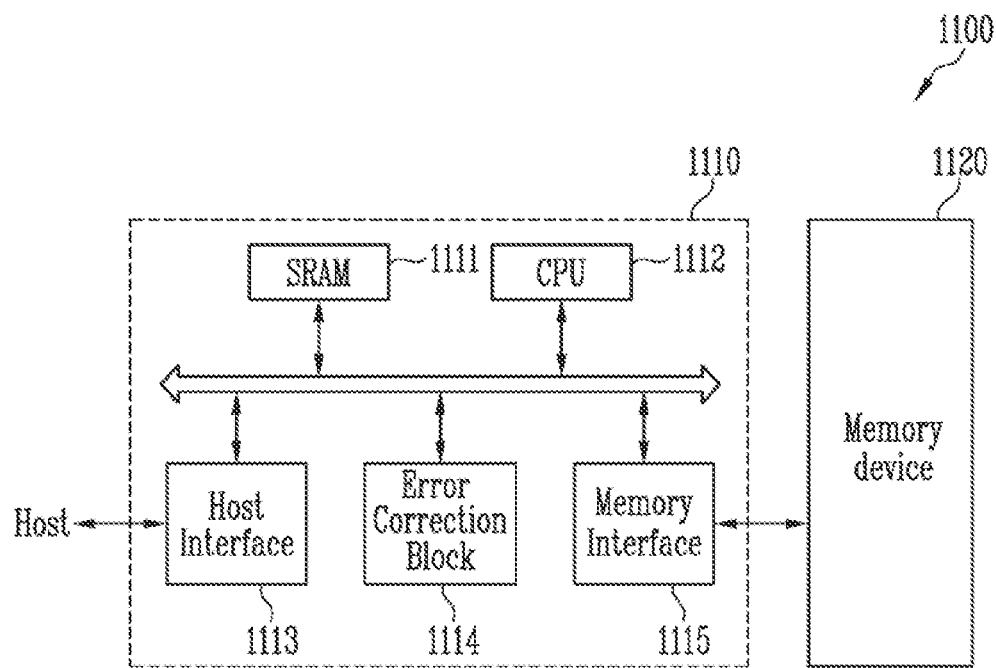
FIG. 13 is a block diagram illustrating a configuration of a memory system in accordance with an embodiment of the present disclosure.

FIG. 13 is a block diagram illustrating a configuration of a memory system in accordance with an embodiment of the present disclosure.

Referring to FIG. 13, the memory system 1100 includes a memory device 1120 and a memory controller 1110.

The memory device 1120 may be a multi-chip package configured with a plurality of flash memory chips. The memory device 1120 may include a first source pattern that is disposed between a memory cell array and a peripheral circuit structure, a second source pattern that is connected to the memory cell array, and a cell-array-side pad pattern that is connected to the second source pattern, the cell-array-side pad pattern being bonded directly to the first source pattern. The first source pattern may be net-shaped with an opening. The memory device 1120 may further include a peripheral-circuit-side pad pattern that is disposed in the opening of the first source pattern, and a bit line that is connected to the memory cell array, the bit line overlapping with the peripheral-circuit-side pad pattern. The bit line may be connected to the peripheral circuit structure via the peripheral-circuit-side pad pattern.

The memory controller 1110 may control the memory device 1120 and may include Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 performs overall control operations for data exchange of the memory controller 1110, and the host interface 1113 may include a data exchange protocol for a host connected with the memory system 1100. The error correction block 1114 may detect an error included in a data read from the memory device 1120, and corrects the detected error. The memory interface 1115 may interface with the memory device 1120. The memory controller 1110 may further include Read Only Memory (ROM) for storing code data for interfacing with the host, and the like.

The memory system 1100, configured as described above, may be a memory card or a Solid State Drive (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 14:
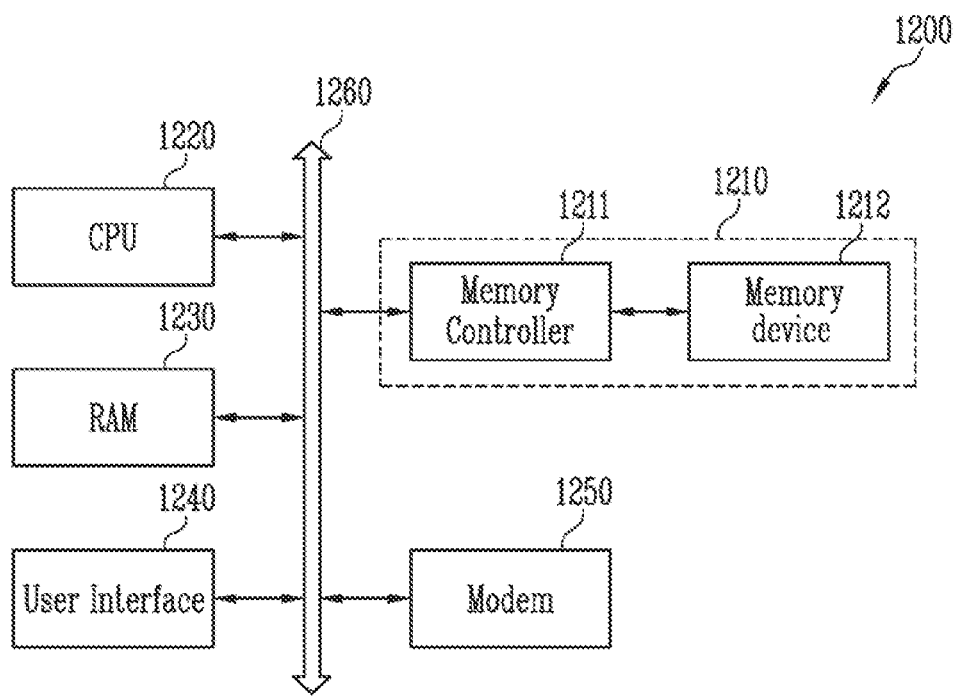
FIG. 14 is a block diagram illustrating a configuration of a computing system in accordance with an embodiment of the present disclosure.

FIG. 14 is a block diagram illustrating a configuration of a computing system in accordance with an embodiment of the present disclosure.

Referring to FIG. 14, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211.

The memory device 1212 may include a first source pattern disposed between a memory cell array and a peripheral circuit structure, a second source pattern connected to the memory cell array, and a cell-array-side pad pattern connected to the second source pattern, the cell-array-side pad pattern being bonded directly to the first source pattern. The first source pattern may be net-shaped with an opening. The memory device 1212 may further include a peripheralcircuit-side pad pattern disposed in the opening of the first source pattern, and a bit line connected to the memory cell array, the bit line overlapping with the peripheral-circuit-side pad pattern. The bit line may be connected to the peripheral circuit structure via the peripheral-circuit-side pad pattern.

The memory controller 1211 may be configured the same as the memory controller 1110 described above with reference to FIG. 13.

In accordance with the present disclosure, a structure for electrical connection between a peripheral circuit and a memory cell array may be designed by using an opening of a source pattern disposed between the peripheral circuit and the memory cell array.

What is claimed is:

1. A semiconductor memory device comprising:
   a peripheral circuit structure with a page buffer group;
   a net-shaped first source pattern disposed over the peripheral circuit structure, the net-shaped first source pattern with a plurality of openings;
   a memory cell array disposed over the net-shaped first source pattern;
   a second source pattern disposed between the net-shaped first source pattern and the memory cell array; and
   a cell-array-side pad pattern, disposed between the net-shaped first source pattern and the second source pattern; and
   a peripheral-circuit-side pad pattern disposed in the net-shaped first source pattern and contacting to the peripheral circuit structure;
   wherein the cell-array-side pad pattern includes a first surface contacting the net-shaped first source pattern and a second surface contacting the second source pattern, the second surface being opposite the first surface;
   wherein the plurality of openings includes a plurality of first openings not overlapping the second source pattern and a plurality of second openings overlapping the second source pattern;
   wherein the peripheral-circuit-side pad pattern is disposed in each of the plurality of first openings.

2. The semiconductor memory device of claim 1, wherein a specific resistance of the net-shaped first source pattern is lower than that of the second source pattern.

3. The semiconductor memory device of claim 2, wherein the net-shaped first source pattern includes a metal, and
   wherein the second source pattern includes a doped semiconductor.

4. The semiconductor memory device of claim 1, wherein the net-shaped first source pattern includes aluminum, and
   wherein the cell-array-side pad pattern includes copper.

5. The semiconductor memory device of claim 1, wherein the memory cell array includes:
   a gate stack structure with interlayer insulating layers and conductive patterns, which are alternately stacked on the second source pattern;
   a channel layer penetrating the gate stack structure; and
   a memory layer disposed between the channel layer and the gate stack structure.

6. The semiconductor memory device of claim 5, wherein the second source pattern includes:
   a horizontal part extending in parallel to the net-shaped first source pattern; and
   a vertical part extending toward a central region of the channel layer from the horizontal part.

7. The semiconductor memory device of claim 5, wherein the plurality of openings include:
   a first opening not overlapping with the gate stack structure; and
   a second opening overlapping with the gate stack structure.

8. The semiconductor memory device of claim 7, further comprising:
   an upper insulating layer disposed over the gate stack structure;
   a bit line contact penetrating the upper insulating layer, the bit line contact being connected to the channel layer;
   a bit line disposed on the upper insulating layer, the bit line overlapping with the first opening;
   a peripheral-circuit-side pad pattern disposed in the first opening of the net-shaped first source pattern, the peripheral-circuit-side pad pattern being connected to the page buffer group; and
   a contact structure extending toward the bit line from the peripheral-circuit-side pad pattern, the contact structure penetrating the upper insulating layer.

9. The semiconductor memory device of claim 8, wherein the peripheral-circuit-side pad pattern is made of the same conductive material as the net-shaped first source pattern.

10. The semiconductor memory device of claim 8, further comprising:
    a first insulating pattern formed in the first opening to insulate the peripheral-circuit-side pad pattern from the net-shaped first source pattern; and
    a second insulating pattern filling the second opening.

11. The semiconductor memory device of claim 8, wherein the conductive patterns include:
    a source select line disposed on the second source pattern;
    word lines stacked on the source select line to be spaced apart from each other; and
    drain select lines disposed over the word lines, the drain select lines being separated from each other at the same level, and
    wherein the upper insulating layer extends between the drain select lines.

* * * * *